US012811098B2

(12) United States Patent
Kapoor

(10) Patent No.: US 12,811,098 B2
(45) **Date of Patent: *Nov. 24, 2026**

(54) RADIO FREQUENCY POWER GENERATOR HAVING MULTIPLE OUTPUT PORTS

(71) Applicant: Lam Research Corporation, Fremont, CA (US)

(72) Inventor: Sunil Kapoor, Vancouver, WA (US)

(73) Assignee: Lam Research Corporation, Fremont, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 18/982,327

(22) Filed: Dec. 16, 2024

(65) Prior Publication Data

US 2025/0118533 A1 Apr. 10, 2025

Related U.S. Application Data

(63) Continuation of application No. 17/597,932, filed as application No. PCT/US2020/070333 on Jul. 30, 2020, now Pat. No. 12,205,796.

(Continued)

(51) Int. Cl.

*H01J 37/32* (2006.01)
*H03G 3/30* (2006.01)
*H10P 14/60* (2026.01)

(52) U.S. Cl.

CPC .. *H01J 37/32174* (2013.01); *H01J 37/32899* (2013.01); *H01J 37/32926* (2013.01); *H03G 3/3042* (2013.01); *H10P 14/6336* (2026.01)

(58) Field of Classification Search

CPC ........... H01J 37/32174; H01J 37/32899; H01J 37/32926; H03G 3/3042; H03G 3/30; H10P 14/6336

See application file for complete search history.

(56) References Cited

U.S. PATENT DOCUMENTS 3,995,237 A 11/1976 Brunner
4,044,357 A 8/1977 Goldie (Continued)

FOREIGN PATENT DOCUMENTS

CN 1233147 A 10/1999
CN 1619767 A 5/2005

(Continued)

OTHER PUBLICATIONS

Andersson C.M., et al., "A Sic Varactor with Large Effective Tuning Range for Microwave Power Applications," IEEE Electron Device Letters, Jun. 2011, vol. 32(6), pp. 788-790.

(Continued)

*Primary Examiner* — Abdullah A Riyami
*Assistant Examiner* — Syed M Kaiser
(74) *Attorney, Agent, or Firm* — Weaver Austin Villeneuve & Sampson LLP

(57) ABSTRACT

A radio frequency (RF) power generator adapted for coupling to a multi-station integrated circuit fabrication chamber may include an oscillator to provide a periodic signal and one or more preamplifiers each having an input port to receive a signal from the oscillator and having an output port to provide an amplified signal. The RF generator may additionally include one or more constant-gain amplifiers, each having an input port to receive a signal from the one or (Continued)

more preamplifiers, and an output port configured for coupling an amplified signal to an electrode for generating a plasma in an assigned station of the multi-station integrated circuit fabrication chamber.

14 Claims, 6 Drawing Sheets

Related U.S. Application Data

(60) Provisional application No. 62/880,822, filed on Jul. 31, 2019.

(56) References Cited

U.S. PATENT DOCUMENTS

| | | | |
|---|---|---|---|
| 4,316,254 | A | 2/1982 | Levin |
| 5,130,678 | A | 7/1992 | Edwards |
| 5,155,547 | A | 10/1992 | Casper et al. |
| 5,195,045 | A | 3/1993 | Keane et al. |
| 5,314,603 | A | 5/1994 | Sugiyama et al. |
| 5,369,795 | A | 11/1994 | Yanagimoto |
| 5,499,384 | A * | 3/1996 | Lentz .................. G06F 13/4018 710/200 |
| 5,572,170 | A | 11/1996 | Collins et al. |
| 5,580,385 | A | 12/1996 | Paranjpe et al. |
| 5,643,364 | A | 7/1997 | Zhao et al. |
| 5,770,922 | A | 6/1998 | Gerrish et al. |
| 5,866,985 | A | 2/1999 | Coultas et al. |
| 5,897,713 | A | 4/1999 | Tomioka et al. |
| 6,020,794 | A | 2/2000 | Wilbur |
| 6,028,014 | A | 2/2000 | Sukjarev |
| 6,054,013 | A | 4/2000 | Collins et al. |
| 6,068,784 | A | 5/2000 | Collins et al. |
| 6,239,587 | B1 | 5/2001 | Buck |
| 6,251,792 | B1 | 6/2001 | Collins et al. |
| 6,288,493 | B1 | 9/2001 | Lee et al. |
| 6,339,206 | B1 | 1/2002 | Johnson |
| 6,367,410 | B1 | 4/2002 | Leahey et al. |
| 6,388,226 | B1 | 5/2002 | Smith et al. |
| 6,444,137 | B1 | 9/2002 | Collins et al. |
| 6,447,636 | B1 | 9/2002 | Qian et al. |
| 6,518,195 | B1 | 2/2003 | Collins et al. |
| 6,632,324 | B2 | 10/2003 | Chan |
| 6,815,633 | B1 | 11/2004 | Chen et al. |
| 6,833,050 | B2 | 12/2004 | Jeon et al. |
| 6,887,339 | B1 | 5/2005 | Goodman et al. |
| 6,922,324 | B1 | 7/2005 | Horwitz |
| 6,939,434 | B2 | 9/2005 | Collins et al. |
| 7,042,311 | B1 | 5/2006 | Hilliker et al. |
| 7,777,152 | B2 | 8/2010 | Todorov et al. |
| 8,179,050 | B2 | 5/2012 | Chen |
| 8,187,416 | B2 | 5/2012 | Miller et al. |
| 8,190,380 | B2 | 5/2012 | Choueiry et al. |
| 8,282,983 | B1 | 10/2012 | Kapoor et al. |
| 8,368,308 | B2 | 2/2013 | Banna et al. |
| 8,485,127 | B2 | 7/2013 | Nishimoto et al. |
| 8,617,351 | B2 | 12/2013 | Hoffman et al. |
| 8,823,357 | B2 | 9/2014 | Shafer et al. |
| 9,082,589 | B2 | 7/2015 | Thomas et al. |
| 9,518,554 | B2 | 12/2016 | Mongin et al. |
| 9,526,161 | B2 | 12/2016 | Habu |
| 9,596,744 | B2 | 3/2017 | Leeser |
| 9,704,692 | B2 | 7/2017 | Leeser |
| 9,773,643 | B1 | 9/2017 | Singhal et al. |
| 9,779,196 | B2 | 10/2017 | Valcore, Jr. et al. |
| 9,859,088 | B2 | 1/2018 | Shaikh |
| 9,918,376 | B2 | 3/2018 | Thomas et al. |
| 10,187,032 | B2 | 1/2019 | Kapoor et al. |
| 10,224,184 | B2 | 3/2019 | Van Zyl |
| 10,269,540 | B1 | 4/2019 | Carter et al. |
| 10,304,663 | B1 | 5/2019 | Kapoor et al. |
| 10,354,838 | B1 | 7/2019 | Mopidevi et al. |
| 10,388,485 | B2 | 8/2019 | Shaikh |
| 10,553,465 | B2 | 2/2020 | Augustyniak et al. |
| 10,825,655 | B1 | 11/2020 | Lee |
| 10,950,421 | B2 | 3/2021 | Valcore, Jr. |
| 11,527,385 | B2 | 12/2022 | Maw et al. |
| 11,756,768 | B2 | 9/2023 | Hasegawa et al. |
| 11,984,298 | B2 | 5/2024 | Juco et al. |
| 11,994,542 | B2 | 5/2024 | Kapoor et al. |
| 12,136,938 | B2 | 11/2024 | Juco et al. |
| 12,205,796 | B2 | 1/2025 | Kapoor |
| 12,283,462 | B2 | 4/2025 | Mopidevi et al. |
| 12,626,895 | B2 | 5/2026 | Kapoor et al. |
| 2001/0042594 | A1 | 11/2001 | Shamouilian et al. |
| 2001/0054383 | A1 | 12/2001 | Pu et al. |
| 2002/0023899 | A1 | 2/2002 | Khater et al. |
| 2002/0038688 | A1 | 4/2002 | Nakano et al. |
| 2002/0129904 | A1 | 9/2002 | Itabashi et al. |
| 2002/0180534 | A1 | 12/2002 | Bohn et al. |
| 2003/0046013 | A1 | 3/2003 | Gerrish |
| 2003/0106645 | A1 | 6/2003 | Ni et al. |
| 2003/0141821 | A1 | 7/2003 | Nakano et al. |
| 2003/0146803 | A1 | 8/2003 | Pickard et al. |
| 2003/0157812 | A1 | 8/2003 | Narwankar et al. |
| 2004/0032212 | A1 | 2/2004 | Yuzurihara et al. |
| 2004/0116080 | A1 | 6/2004 | Chen et al. |
| 2004/0195972 | A1 | 10/2004 | Cornelius |
| 2004/0236524 | A1 | 11/2004 | Mundt |
| 2004/0253921 | A1 | 12/2004 | Turner |
| 2005/0001556 | A1 | 1/2005 | Hoffman et al. |
| 2005/0069651 | A1 | 3/2005 | Miyoshi et al. |
| 2005/0106873 | A1 | 5/2005 | Hoffman et al. |
| 2005/0134186 | A1 | 6/2005 | Brouk et al. |
| 2005/0161769 | A1 | 7/2005 | Coolbaugh et al. |
| 2005/0205532 | A1 | 9/2005 | Patrick et al. |
| 2006/0116106 | A1 | 6/2006 | Turner |
| 2007/0153780 | A1 | 7/2007 | Stanley |
| 2007/0166134 | A1 | 7/2007 | Suzuki |
| 2007/0251920 | A1 | 11/2007 | Hoffman |
| 2007/0256787 | A1 | 11/2007 | Chandrachood et al. |
| 2007/0275486 | A1 | 11/2007 | Hiroki |
| 2008/0106206 | A1 | 5/2008 | Hooke et al. |
| 2008/0179948 | A1 | 7/2008 | Nagarkatti et al. |
| 2008/0264904 | A1 | 10/2008 | Yuen et al. |
| 2009/0037999 | A1 | 2/2009 | Anderson et al. |
| 2009/0162570 | A1 | 6/2009 | Swenberg et al. |
| 2009/0250334 | A1 | 10/2009 | Qiu et al. |
| 2009/0255800 | A1 | 10/2009 | Koshimizu |
| 2009/0278512 | A1 | 11/2009 | Karlicek et al. |
| 2009/0289630 | A1 | 11/2009 | Nascimento et al. |
| 2010/0025384 | A1 | 2/2010 | Todorow et al. |
| 2010/0171427 | A1 | 7/2010 | Kirchmeier et al. |
| 2010/0243162 | A1 | 9/2010 | Koshimizu |
| 2010/0276391 | A1 | 11/2010 | Grimbergen et al. |
| 2011/0063042 | A1 | 3/2011 | Mendolia et al. |
| 2011/0101862 | A1 | 5/2011 | Koo et al. |
| 2011/0140607 | A1 | 6/2011 | Moore et al. |
| 2011/0148303 | A1 | 6/2011 | Van Zyl et al. |
| 2011/0214811 | A1 | 9/2011 | Ashida |
| 2012/0073757 | A1 | 3/2012 | Yamazawa |
| 2012/0074844 | A1 | 3/2012 | York et al. |
| 2012/0212135 | A1 | 8/2012 | Suzuki |
| 2012/0247679 | A1 | 10/2012 | Yamazawa |
| 2012/0298303 | A1 | 11/2012 | Ikeda et al. |
| 2013/0076343 | A1 | 3/2013 | Carpenter et al. |
| 2013/0105082 | A1 | 5/2013 | Melikyan et al. |
| 2013/0197874 | A1 | 8/2013 | Heckel |
| 2013/0234741 | A1 | 9/2013 | Mow et al. |
| 2013/0256271 | A1 | 10/2013 | Panagopoulos et al. |
| 2014/0008357 | A1 | 1/2014 | Cheng et al. |
| 2014/0062303 | A1 | 3/2014 | Hoffman et al. |
| 2014/0087668 | A1 | 3/2014 | Mow et al. |
| 2014/0097751 | A1 | 4/2014 | Thomas et al. |
| 2014/0155008 | A1 | 6/2014 | Van Zyl |
| 2014/0214350 | A1 | 7/2014 | Valcore, Jr. et al. |
| 2014/0231389 | A1 | 8/2014 | Nagami et al. |
| 2014/0232483 | A1 | 8/2014 | Correa et al. |
| 2014/0367043 | A1 | 12/2014 | Bishara et al. |
| 2015/0037972 | A1 | 2/2015 | Danek et al. |
| 2015/0221478 | A1 | 8/2015 | Himori et al. |
| 2015/0235811 | A1 | 8/2015 | Cooperberg et al. |
| 2015/0255242 | A1 | 9/2015 | DiVergilio et al. |

(56) References Cited

U.S. PATENT DOCUMENTS

2015/0255994 A1 9/2015 Kesler et al.
2015/0313000 A1 10/2015 Thomas et al.
2015/0318146 A1 11/2015 Kim
2015/0319837 A1 11/2015 Bhutta
2015/0332894 A1 11/2015 Valcore, Jr. et al.
2015/0340204 A1 11/2015 Kudela et al.
2015/0348854 A1* 12/2015 Kapoor ............. C23C 16/45536
2015/0357210 A1 12/2015 Mori et al.
2015/0371832 A1 12/2015 Yanai et al.
2015/0371876 A1 12/2015 Terauchi et al.
2016/0065207 A1 3/2016 Bhutta
2016/0087687 A1 3/2016 Kesler et al.
2016/0113103 A1 4/2016 Van Zyl
2016/0181866 A1 6/2016 Moeskops
2016/0233047 A1 8/2016 Tang et al.
2016/0295677 A1 10/2016 Leeser
2016/0322215 A1 11/2016 Shaikh
2016/0351375 A1 12/2016 Valcore, Jr. et al.
2017/0004955 A1 1/2017 Leeser
2017/0062187 A1 3/2017 Radomski et al.
2017/0076917 A1 3/2017 Yudovsky et al.
2017/0117869 A1 4/2017 Leeser et al.
2017/0121819 A1 5/2017 Swaminathan et al.
2017/0213702 A1 7/2017 Hammond, IV et al.
2017/0213758 A1 7/2017 Rice et al.
2017/0236693 A1 8/2017 Kobayashi et al.
2017/0244582 A1* 8/2017 Gal ................... H04L 25/03885
2017/0256416 A1 9/2017 Fischer et al.
2017/0330732 A1 11/2017 Valcore, Jr. et al.
2017/0330744 A1 11/2017 Keil et al.
2017/0345620 A1 11/2017 Coumou et al.
2017/0365907 A1 12/2017 Kapoor et al.
2017/0372870 A1 12/2017 Godyak et al.
2018/0023158 A1 1/2018 Sasaki et al.
2018/0025930 A1 1/2018 Augustyniak et al.
2018/0068834 A1 3/2018 Valcore, Jr. et al.
2018/0097520 A1 4/2018 Wu
2018/0130696 A1 5/2018 Konkola et al.
2018/0144903 A1 5/2018 Shaikh
2018/0163302 A1 6/2018 Kapoor et al.
2018/0231587 A1 8/2018 Ye et al.
2018/0233326 A1 8/2018 Tan et al.
2018/0261431 A1 9/2018 Hammond, IV et al.
2018/0308663 A1 10/2018 Collins et al.
2018/0308664 A1 10/2018 Collins et al.
2018/0350649 A1 12/2018 Gomm
2018/0351322 A1 12/2018 Kurosawa et al.
2018/0366304 A1 12/2018 Shim et al.
2018/0366378 A1 12/2018 Kim et al.
2019/0013222 A1 1/2019 Kim et al.
2019/0049534 A1* 2/2019 Guan ............... G01R 19/16566
2019/0051496 A1 2/2019 Collins et al.
2019/0068158 A1 2/2019 Coumou et al.
2019/0108979 A1 4/2019 Higuchi
2019/0148118 A1 5/2019 Zhang et al.
2019/0149119 A1 5/2019 Kapoor et al.
2019/0198345 A1 6/2019 Fischer et al.
2019/0228950 A1 7/2019 Funk et al.
2019/0288737 A1 9/2019 Hanks et al.
2019/0391547 A1 12/2019 Coumou et al.
2020/0010957 A1 1/2020 Chen et al.
2020/0105573 A1 4/2020 Schaller et al.
2020/0118792 A1 4/2020 Mopidevi et al.
2020/0118856 A1 4/2020 Augustyniak et al.
2020/0126762 A1 4/2020 Yang et al.
2020/0161104 A1 5/2020 Ni et al.
2020/0194235 A1 6/2020 Kim et al.
2020/0211873 A1 7/2020 Zhao et al.
2020/0333434 A1* 10/2020 Chancey .................. G09B 9/54
2020/0381213 A1 12/2020 Lian et al.
2020/0411286 A1 12/2020 Koshimizu et al.
2021/0005474 A1 1/2021 Hong
2021/0090935 A1 3/2021 Koai et al.
2021/0098233 A1 4/2021 Kapoor et al.
2021/0159107 A1 5/2021 Woo
2021/0183619 A1 6/2021 Patrick et al.
2021/0302478 A1 9/2021 Kapoor et al.
2021/0313948 A1 10/2021 Leeser et al.
2022/0190854 A1 6/2022 Juco et al.
2022/0328236 A1 10/2022 Kapoor
2022/0344129 A1 10/2022 Kapoor
2022/0375721 A1 11/2022 Fields et al.
2022/0415616 A1 12/2022 Juco et al.
2023/0052543 A1 2/2023 Linebarger, Jr. et al.
2023/0223238 A1 7/2023 Guo et al.
2023/0326720 A1 10/2023 Mopidevi et al.
2024/0047291 A1 2/2024 Won et al.
2024/0203711 A1 6/2024 Kapoor et al.
2024/0258073 A1 8/2024 Juco et al.
2024/0272210 A1 8/2024 Kapoor et al.
2025/0015819 A1 1/2025 Juco et al.
2025/0038034 A1 1/2025 Topping et al.
2025/0132127 A1 4/2025 Guo et al.
2025/0246406 A1 7/2025 Dehghan et al.

FOREIGN PATENT DOCUMENTS

CN 1656593 A 8/2005
CN 1925322 A 3/2007
CN 101630624 A 1/2010
CN 101866808 A 10/2010
CN 101933225 A 12/2010
CN 102037789 A 4/2011
CN 102272869 A 12/2011
CN 103533690 A 1/2014
CN 105321792 A 2/2016
CN 107419238 A 12/2017
CN 108109897 A 6/2018
CN 108494381 A 9/2018
CN 109036817 A 12/2018
CN 109659215 A 4/2019
CN 112753089 A 5/2021
EP 0840350 A2 5/1998
EP 0935406 A2 8/1999
EP 0731559 B1 11/2001
EP 2881579 A1 6/2015
EP 2881579 B1 3/2019
GB 1599557 A 10/1981
JP H0589997 A 4/1993
JP H08274067 A 10/1996
JP H10125497 A 5/1998
JP H11233294 A 8/1999
JP 2001057360 A 2/2001
JP 2001249028 A 9/2001
JP 2003517197 A 5/2003
JP 2003302431 A 10/2003
JP 2004031566 A 1/2004
JP 2004266038 A 9/2004
JP 2005527078 A 9/2005
JP 2006019716 A 1/2006
JP 2006209976 A 8/2006
JP 2006286814 A 10/2006
JP 2008276984 A 11/2008
JP 4352562 B2 10/2009
JP 2010065240 A 3/2010
JP 2011096690 A 5/2011
JP 2011515790 A 5/2011
JP 2011135766 A 7/2011
JP 2011222292 A 11/2011
JP 2012033958 A 2/2012
JP 2013216949 A 10/2013
JP 5491109 B2 5/2014
JP 2014099585 A 5/2014
JP 2014142266 A 8/2014
JP 2014186944 A 10/2014
JP 2014186994 A 10/2014
JP 5812561 B2 11/2015
JP 2016009733 A 1/2016
JP 2016184924 A 10/2016
JP 2017510059 A 4/2017
JP 2017143057 A 8/2017
JP 2017168298 A 9/2017
JP 2017199904 A 11/2017
JP 2017224601 A 12/2017

(56) References Cited

FOREIGN PATENT DOCUMENTS

| | | | |
|---|---|---|---|
| JP | 2018011050 | A | 1/2018 |
| JP | 2018022685 | A | 2/2018 |
| JP | 2019504481 | A | 2/2019 |
| JP | 2019071270 | A | 5/2019 |
| JP | 2019517125 | A | 6/2019 |
| JP | 2019133785 | A | 8/2019 |
| JP | 2020510959 | A | 4/2020 |
| JP | 2021503183 | A | 2/2021 |
| JP | 2021052062 | A | 4/2021 |
| JP | 2021515197 | A | 6/2021 |
| KR | 980012069 | A | 4/1998 |
| KR | 20010015590 | A | 2/2001 |
| KR | 20020081228 | A | 10/2002 |
| KR | 20030034108 | A | 5/2003 |
| KR | 20040084477 | A | 10/2004 |
| KR | 20050029122 | A | 3/2005 |
| KR | 20060105668 | A | 10/2006 |
| KR | 20070101654 | A | 10/2007 |
| KR | 20070109275 | A | 11/2007 |
| KR | 20090009681 | U | 9/2009 |
| KR | 20110116939 | A | 10/2011 |
| KR | 20120032449 | A | 4/2012 |
| KR | 20120087925 | A | 8/2012 |
| KR | 20130047532 | A | 5/2013 |
| KR | 101415551 | B1 | 7/2014 |
| KR | 20140104380 | A | 8/2014 |
| KR | 20140118912 | A | 10/2014 |
| KR | 20150039725 | A | 4/2015 |
| KR | 20150139461 | A | 12/2015 |
| KR | 20160000400 | A | 1/2016 |
| KR | 20170054239 | A | 5/2017 |
| KR | 101791-706 | B1 | 10/2017 |
| KR | 20170114800 | A | 10/2017 |
| KR | 2018008063.1 | A | 7/2018 |
| KR | 20180082626 | A | 7/2018 |
| KR | 20180101243 | A | 9/2018 |
| KR | 20190047404 | A | 5/2019 |
| KR | 20190109559 | A | 9/2019 |
| KR | 20200001608 | A | 1/2020 |
| KR | 20200003561 | A | 1/2020 |
| KR | 20200111233 | A | 9/2020 |
| KR | 102505150 | B1 | 2/2023 |
| KR | 20230078792 | A | 6/2023 |
| TW | 200509194 | A | 3/2005 |
| TW | 200518210 | A | 6/2005 |
| TW | I290331 | B | 11/2007 |
| TW | 200915717 | A | 4/2009 |
| TW | 201141317 | A | 11/2011 |
| TW | 201143546 | A | 12/2011 |
| TW | 201611153 | A | 3/2016 |
| TW | 201613422 | A | 4/2016 |
| TW | 201808057 | A | 3/2018 |
| TW | 201840989 | A | 11/2018 |
| TW | 201903818 | A | 1/2019 |
| TW | 201920733 | A | 6/2019 |
| TW | 201935596 | A | 9/2019 |
| TW | 202016974 | A | 5/2020 |
| TW | 202020925 | A | 6/2020 |
| TW | 202107516 | A | 2/2021 |
| TW | 202111812 | A | 3/2021 |
| WO | WO-9534945 | A2 | 12/1995 |
| WO | WO-9914855 | A1 | 3/1999 |
| WO | WO-0219387 | A2 | 3/2002 |
| WO | WO-02080220 | A1 | 10/2002 |
| WO | WO-02084698 | A1 | 10/2002 |
| WO | WO-03101160 | A2 | 12/2003 |
| WO | WO-2005031839 | A1 | 4/2005 |
| WO | WO-2009099486 | A1 | 8/2009 |
| WO | WO-2011028600 | A2 | 3/2011 |
| WO | WO-2017100136 | A1 | 6/2017 |
| WO | WO-2018156486 | A1 | 8/2018 |
| WO | WO-2018228133 | A1 | 12/2018 |
| WO | WO-2019079325 | A1 | 4/2019 |
| WO | WO-2019165296 | A1 | 8/2019 |
| WO | WO-2020076413 | A1 | 4/2020 |
| WO | WO-2021081304 | A1 | 4/2021 |
| WO | WO-2023177409 | A1 | 9/2023 |

OTHER PUBLICATIONS

Araujo D., et., "Diamond for electronics: Materials, processing and devices," Materials, 2021, vol. 14(22), pp. 1-25.
Brezeanu M., "Diamond Schottky Barrier Diodes," 2010, pp. 1-164.
CN Office Action dated Mar. 8, 2025 in CN Application No. 202080069268.4, with English Translation.
EP Extended European Search report dated Jul. 14, 2025 in EP Application No. 22854124.9.
Hegazi E., et al., "Varactor Characteristics, Oscillator Tuning Curves, and AM-FM Conversion," IEEE Journal of Solid-State Circuits, Jun. 2003, vol. 38 (6), pp. 1033-1039.
Ibarra A., et al., "Wide Frequency Dielectric Properties of CVD Diamond," Diamond and Related Materials, Apr. 1997, vol. 6(5-7), pp. 856-859.
JP Office Action dated Feb. 10, 2026 in JP Application No. 2024-226845, with English Translation.
JP Office Action dated Feb. 17, 2026 in JP Application No. 2024555090, with English Translation.
JP Office Action dated May 26, 2026 in JP Application No. 2024-505516, with English Translation.
JP Office Action dated Sep. 9, 2025 in JP Application No. 2024-172857, with English Translation.
Kalish R., "Doping of diamond," Carbon, 1999, vol. 37, pp. 781-785.
Kawarada H., et., "Wide Temperature K-700k) and High Voltage (~ V) Operation of C—H Diamond MOSFETs for Power Electronics Application," IEEE International Electron Devices Meeting, 2014, 4 Pages.
KR Office Action dated Dec. 29, 2025 in KR Application No. 10-2024-7034530, with English Translation.
KR Office Action dated Feb. 19, 2025 in KR Application No. 10-2022-7022290, with English Translation.
KR Office Action dated Jan. 19, 2026 in KR Application No. 10-2024-7007519, with English Translation.
KR Office Action dated Jan. 20, 2025 in KR Application No. 10-2022-7017491, with English Translation.
KR Office Action dated Jul. 3, 2025 in KR Application No. 10-2022-7042490, with English Translation.
KR Office Action dated Mar. 13, 2025 in KR Application No. 20227030866, with English Translation.
KR Office Action dated Oct. 21, 2025 in KR Application No. 10-2022-7030866, with English Translation.
Liao M., et al., Ultra-wide Bandgap Semiconductor Materials, Elsevier, 2019, 234 pages.
Makino T., et al., "Diamond Schottky P-n Diode with High Forward Current Density," Physica status solidi, 2009, pp. 2086-2090.
Masante C., "Diamond MOSFET for Power Electronics. Micro and Nanotechnologies/microelectronics," Universite grenoble alpes, 2019, 159 Pages.
Merchant S., et al., "Realization of High Breakdown Voltage ( 700 V) in Thin SOI Devices," IEEE Proceedings of the 3rd International Symposium on Power Semiconductor Devices and ICs, 1991, pp. 31-35.
Peatman W.C.B., et al., "Design and Fabrication of Heterostructure Varactor Diodes for Millimeter and Submillimeter Wave Multiplier Applications," Proceedings IEEE/Cornell Conference on Advanced Concepts in High Speed Semiconductor Devices and Circuits, 1991, pp. 49-57.
Rouger N., et al., "Design of Diamond Power Devices: Application to Schottky Barrier Diodes," Energies, 2019, vol. 12 (12), pp. 1-17.
SG Search Report and Written Opinion dated Aug. 12, 2025 in SG Application No. 11202253460Y.
SG Search Report and Written Opinion dated Aug. 18, 2025 in SG Application No. 11202254750X.
SG Search Report and Written Opinion dated Jun. 23, 2025 in SG Application No. 11202204256Y.

(56) References Cited

OTHER PUBLICATIONS

Sudow M., et al., "Sic Varactors for Dynamic Load Modulation of High Power Amplifiers," IEEE electron device letters, 2008, vol. 29 (7), pp. 728-730.
TW Office Action and Search Report dated Apr. 9, 2025 in TW Application No. 110120724, with English Translation.
TW Office Action and Search Report dated Feb. 12, 2026 in TW Application No. 111129498, with English Translation.
TW Office Action and Search Report dated Feb. 18, 2025 in TW Application No. 110115860, with English Translation.
TW Office Action and Search Report dated Jan. 5, 2026 in TW Application No. 111119061, with English Translation.
TW Office Action dated Mar. 13, 2026 in TW Application No. 114125016, with English Translation.
TW Office Action dated May 29, 2025 in TW Application No. 110111059, with English Translation.
TW Office Action dated Nov. 3, 2025 in TW Application No. 110111059, with English Translation.
U. S. Final Office Action dated Dec. 3, 2025 in U.S. Appl. No. 17/997,802.
Umezawa H., et al., "Diamond Schottky Barrier Diode for High-temperature, High-power, and Fast Switching Applications," Japanese Journal of Applied Physics, 2014, vol. 53 ,5 Pages.
U.S. Non-Final Office Action dated Aug. 27, 2025 in U.S. Appl. No. 17/997,802.
U.S. Non-Final Office Action dated Feb. 4, 2026 in U.S. Appl. No. 18/847,308.
U.S. Non-Final Office Action dated Feb. 26, 2026 in U.S. Appl. No. 18/834,982.
US Non-Final Office Action dated Jun. 24, 2025 in U.S. Appl. No. 17/760,159.
U.S. Non-Final Office Action dated Mar. 6, 2025 in U.S. Appl. No. 17/907,067.
U.S. Non-Final Office Action dated Mar. 9, 2026 in U.S. Appl. No. 17/997,802.
U.S. Notice of Allowance dated Apr. 14, 2025 in U.S. Appl. No. 18/631,368.
U.S. Notice of Allowance dated Aug. 29, 2025 in U.S. Appl. No. 17/907,067.
U.S. Notice of Allowance dated Feb. 18, 2026 in U.S. Appl. No. 17/907,067.
U.S. Notice of Allowance dated May 6, 2026 in U.S. Appl. No. 18/681,489.
U.S. Appl. No. 19/577,075, inventors Kapoor S et al., filed on Mar. 24, 2026.
U.S. Restriction Requirement dated Apr. 10, 2025 in U.S. Appl. No. 17/760,159.
U.S. Restriction Requirement dated Mar. 14, 2025 in U.S. Appl. No. 17/997,802.
U.S. Restriction Requirement dated May 23, 2025 in U.S. Appl. No. 17/754,202.
Volpe P.N., et al., "Extreme Dielectric Strength in Boron Doped Homoepitaxial Diamond," Applied Physics Letters, 2010, vol. 97, 4 Pages.
Chinese First Office Action dated Aug. 27, 2015 issued in Application No. CN201310467492.0.
Chinese First Office Action dated May 17, 2017 issued in Application No. CN 201610428220.3.
Chinese Second Office Action dated Mar. 5, 2018 issued in Application No. CN201610428220.3.
Chinese Third Office Action dated Aug. 15, 2018 issued in Application No. CN201610428220.3.
CN Office Action dated Oct. 11, 2023, in application No. CN202080056165.4 with English translation.
CN Office Action dated Oct. 24, 2023, in application No. CN202080034447.4 with English translation.
CN Office Action dated Oct. 31, 2024 in CN Application No. 202080074587.4 with English translation.
Final Office Action dated Jul. 7, 2017 issued in U.S. Appl. No. 14/737,377.
International Preliminary Report on Patentability and Written Opinion dated Aug. 15, 2024 in PCT Application No. PCT/US2023/011463.
International Preliminary Report on Patentability and written opinion dated Aug. 25, 2022 in Application PCT/US2021/017227.
International Preliminary Report on Patentability and Written Opinion dated Feb. 15, 2024 in PCT Application No. PCT/US2022/074608.
International Preliminary Report on Patentability and written opinion dated Nov. 17, 2022 in Application PCT/US2021/030177.
International Preliminary Report on Patentability and Written Opinion dated Oct. 3, 2024 in PCT Application No. PCT/US2022/030252.
International Preliminary Report on Patentability dated Apr. 14, 2022 from PCT/US2020/053014.
International Preliminary Report on Patentability dated Feb. 10, 2022 issued in Application No. PCT/US2020/070333.
International Preliminary Report on Patentability dated Jan. 12, 2023, in PCT Application No. PCT/US2021/038457.
International Preliminary Report on Patentability dated Jun. 16, 2022, in PCT Application No. PCT/US2020/062924.
International Preliminary Report on Patentability dated Nov. 18, 2021, issued inPCT/US2020/030835.
International Preliminary Report on Patentability dated Oct. 6, 2022 in PCT Application PCT/US2021/023942.
International Preliminary Reporton Patentability dated Dec. 22, 2022, in PCT Application No. PCT/US2021/036163.
International Search Report and Written Opinion dated Apr. 7, 2021 issued in Application No. PCT/US2020/062924.
International Search Report and Written Opinion dated Aug. 17, 2021 issued in Application No. PCT/US2021/030177.
International Search Report and Written Opinion dated Aug. 21, 2020 issued in Application No. PCT/US2020/030835.
International Search Report and Written Opinion dated Dec. 16, 2022 in PCT Application No. PCT/US2022/030252.
International Search Report and Written Opinion dated Feb. 3, 2021 issued in Application No. PCT/US2020/057020.
International Search Report and Written Opinion dated Jan. 19, 2021, for International Application No. PCT/US2020/053014.
International Search Report and Written Opinion dated Jul. 15, 2021 issued in Application No. PCT/US2021/023942.
International Search Report and Written Opinion dated Jun. 2, 2023, in Application No. PCT/US2023/011463.
International Search Report and Written Opinion dated Jun. 4, 2021 issued in Application No. PCT/US2021/017227.
International Search Report and Written Opinion dated Nov. 11, 2020 issued in Application No. PCT/US2020/070333.
International Search Report and Written Opinion dated Nov. 18, 2022 in PCT Application No. PCT/US2022/074608.
International Search Report and Written Opinion dated Oct. 14, 2021, in application No. PCT/US2021/038457.
International Search Report and Written Opinion dated Sep. 27, 2021 issued in Application No. PCT/US2021/036163.
JP Notice of Allowances dated Sep. 3, 2024 in JP Application No. 2022-506171 with English translation.
JP Notice of Allowances dated Sep. 10, 2024 in JP Application No. 2022-530889 with English translation.
JP Office Action dated Apr. 30, 2024 in JP Application No. 2022-506171, with English Translation.
JP Office Action dated Aug. 27, 2024 in JP Application No. 2022-547225 with English translation.
JP Office Action dated Jun. 11, 2024 in JP Application No. 2022-530889 with English translation.
JP Office Action dated Jun. 18, 2024 in JP Application No. 2022-523827 with English Translation.
JP Office Action dated May 7, 2024 in JP Application No. 2021-564697, with English Translation.
JP Office Action dated Oct. 1, 2024 in JP Application No. 2022-520163 with English translation.
Korean Decision for Grant of Patent dated Jan. 18, 2020 issued in Application No. KR 10-2013-0120518.
KR Notice of Allowance dated Nov. 28, 2024 in KR Application No. 10-2023-7006703, with English Translation.

(56) References Cited

OTHER PUBLICATIONS

KR Office Action dated Aug. 4, 2022 in Application No. KR10-2022-7013719 With English translation.
KR Office Action dated Aug. 23, 2024 in KR Application No. 10-2023-7006703, with English Translation.
KR Office Action dated Dec. 18, 2024 in KR Application No. 10-2022-7006928, with English Translation.
KR Office Action dated Feb. 24, 2023 in Application No. KR10-2022-7025826 with English translation.
KR Office Action dated Jan. 16, 2024 in KR Application No. 10-2023-7006703 with English translation.
KR Office Action dated May 21, 2024 in KR Application No. 10-2019-0071320, with English translation.
KR Office Action dated Sep. 21, 2022 in Application No. KR10-2022-7025826 with English translation.
Notice of Allowance dated Mar. 31, 2015 issued in U.S. Appl. No. 13/648,183.
Notice of Allowance dated Oct. 31, 2017 issued in U.S. Appl. No. 14/737,377.
Office Action dated Sep. 23, 2016 issued in U.S. Appl. No. 14/737,377.
PCT International Preliminary Report on Patentability dated May 5, 2022 issued in PCT/US2020/057020.
SG Search Report and Written Opinion dated Nov. 1, 2023 in SG Application No. 11202111969R.
SG Search Report and Written Opinion dated Nov. 15, 2023 in SG Application No. 11202202918X.
SG Search report dated Jul. 16, 2024 in Application No. SG11202205585V.
Taiwanese Notice of Allowance dated Jan. 19, 2017 issued in Application No. TW 102136597.
TW Office Action dated Apr. 3, 2024 in TW Application No. 109115006, with English Translation.
TW Office Action dated Aug. 2, 2024 in TW Application No. 109133629 with English translation.
TW Office Action dated May 9, 2024 in TW Application No. 109125947, with English Translation.
TW Office Action dated May 22, 2024 in TW Application No. 109136856, with English translation.
TW Office Action dated Oct. 11, 2024 in TW Application No. 109115006 with English translation.
TW Office Action dated Oct. 11, 2024 in TW Application No. 109125947 with English translation.
TW Office Action dated Sep. 23, 2024 in TW Application No. 110111059 with English translation.
U.S. Corrected Notice of Allowance dated Dec. 5, 2024 in U.S. Appl. No. 17/597,932.
U.S. Corrected Notice of Allowance dated Dec. 20, 2024 in U.S. Appl. No. 18/000,895.
U.S. Corrected Notice of Allowance dated Oct. 7, 2024 in U.S. Appl. No. 17/594,906.
U.S. Final Office Action dated Jun. 28, 2024 in U.S. Appl. No. 17/597,932.
U.S. Non-Final Office Action dated Dec. 21, 2023 in U.S. Appl. No. 17/594,906.
U.S. Non-Final Office Action dated Jul. 3, 2023, in U.S. Appl. No. 16/832,961.
U.S. Non-Final Office Action dated Jul. 5, 2024 in U.S. Appl. No. 18/000,895.
U.S. Non-Final Office Action dated Mar. 8, 2024 in U.S. Appl. No. 17/597,932.
U.S. Non-Final Office Action dated Nov. 13, 2024 in U.S. Appl. No. 18/631,368.
U.S. Notice of Allowance dated Dec. 16, 2024 in U.S. Appl. No. 18/000,895.
U.S. Notice of Allowance dated Feb. 6, 2024 in U.S. Appl. No. 16/832,961.
U.S. Notice of Allowance dated Jan. 12, 2024 in U.S. Appl. No. 17/756,058.
U.S. Notice of Allowance dated Jan. 23, 2024 in U.S. Appl. No. 17/756,058.
U.S. Notice of Allowance dated Jun. 20, 2024 in U.S. Appl. No. 17/594,906.
U.S. Notice of Allowance dated Oct. 20, 2023 in U.S. Appl. No. 16/832,961.
U.S. Notice of Allowance dated Sep. 18, 2024 in U.S. Appl. No. 17/597,932.
U.S. Appl. No. 18/681,489, inventors Guo T et al., filed Feb. 5, 2024.
U.S. Appl. No. 18/834,982, inventors Topping S et al., filed Jul. 31, 2024.
U.S. Appl. No. 18/847,308, inventors Dehghan S, et al., filed Sep. 16, 2024.
U.S. Appl. No. 18/890,408, inventors Juco E.Y, et al., filed Sep. 19, 2024.
U.S. Restriction Requirement dated Aug. 16, 2024 in U.S. Appl. No. 17/755,141.
U.S. Restriction requirement dated Aug. 23, 2024 in U.S. Appl. No. 17/907,067.
U.S. Restriction Requirement dated Feb. 24, 2023 in U.S. Appl. No. 16/832,961.
U.S. Restriction requirement dated Oct. 1, 2024 in U.S. Appl. No. 17/997,802.
U.S. Supplemental Notice of Allowance dated Dec. 30, 2024 in U.S. Appl. No. 18/000,895.

* cited by examiner

RADIO FREQUENCY POWER GENERATOR HAVING MULTIPLE OUTPUT PORTS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Fabrication of integrated circuit devices may involve the processing of semiconductor wafers in a semiconductor processing chamber. Typical processes may involve deposition, in which a semiconductor material may be deposited, such as in a layer-by-layer fashion, as well as removal (e.g., etching) of material in certain regions of the semiconductor wafer. In commercial scale manufacturing, each wafer contains many copies of a particular semiconductor device being manufactured, and many wafers may be utilized to achieve the required volumes of devices. Accordingly, the commercial viability of a semiconductor processing operation may depend, at least to some extent, upon within-wafer uniformity and upon wafer-to-wafer repeatability of the process conditions. Consequently, efforts are made to ensure that each portion of a given wafer, as well as each wafer processed in a semiconductor processing chamber, undergo the same processing conditions. Variation in the processing conditions can bring about undesirable variations in deposition and etch rates, which, in turn, may bring about unacceptable variations in an overall fabrication process. Such variations may degrade circuit performance which, in turn, may give rise to unacceptable variations in performance of higher-level systems, for example, that utilize the integrated circuit devices.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Provided herein are methods and apparatuses for generating radio frequency power adapted for coupling to a multi-station integrated circuit fabrication chamber. One aspect includes an apparatus for generating radio frequency power adapted for coupling to a multi-station integrated circuit fabrication chamber, the apparatus including: an oscillator configured to generate a periodic signal; a plurality of variable-gain preamplifiers each having an input port to receive a signal from the oscillator and having an output port to provide a signal of a varying amplitude; a plurality of constant-gain amplifiers each having an input port to receive a signal from one of the plurality of variable-gain preamplifiers and each having an output port configured for coupling an amplified signal to an electrode for generating plasma in an assigned station of the multi-station integrated circuit fabrication chamber; and a plurality of sensors, each of the plurality of sensors coupled to a corresponding output port of the plurality of constant-gain amplifiers.

In some embodiments, the periodic signal generated by the oscillator includes a frequency of between 300.0 kHz and 100.0 MHz.

In some embodiments, the periodic signal generated by the oscillator includes a frequency selected from the group consisting of 400.0 kHz, 1.0 MHz, 2.0 MHz, 13.56 MHz, 27.12 MHz, 60.0 MHz, or 100.0 MHz.

For any of the above aspects, an output port of each of the plurality of sensors may be coupled to an input port of a control module, and output signals from the control module may be coupled to an input port for adjusting gain of a corresponding variable-gain preamplifier of the plurality of variable-gain preamplifiers.

For any of the above aspects, one or more of the plurality of sensors may be configured to detect an out-of-range parameter selected from the group consisting of: power transmitted to the assigned station of the multi-station integrated circuit fabrication chamber that exceeds a threshold value, power reflected from the assigned station of the multi-station integrated circuit fabrication chamber that exceeds a threshold value, current coupled to the assigned station of the multi-station integrated circuit fabrication chamber that exceeds a threshold value, and voltage applied to the assigned station of the multi-station integrated circuit fabrication chamber that exceeds a threshold value.

For any of the above aspects, the control module may implement circuitry to provide the output signals within 10.0 ns of receipt of a signal from one of the plurality of sensors.

For any of the above aspects, each of the plurality of constant-gain amplifiers may provide an output power of at least about 1000 W.

Another aspect involves an apparatus for generating radio frequency power for coupling to a multi-station integrated circuit fabrication chamber, the apparatus including: an oscillator configured to generate a periodic signal; a preamplifier having an input port to receive a signal from the oscillator and having an output port to provide a signal having a constant gain with respect to the received signal; a plurality of variable-gain amplifiers each having an input port to receive a signal from the preamplifier and each having an output port configured for coupling an amplified signal to an electrode for generating plasma in an assigned station of the multi-station integrated circuit fabrication chamber; and a plurality of sensors, each of the plurality of sensors to provide a control signal to vary an output power of a corresponding one of the plurality of variable-gain amplifiers.

For any of the above aspects, the periodic signal generated by the oscillator may include a frequency of between 300.0 kHz and 100.0 MHz.

For any of the above aspects, the periodic signal generated by the oscillator may include a frequency selected from the group consisting of: 400.0 kHz, 1.0 MHZ, 2.0 MHZ, 13.56 MHZ, 27.12 MHz, 60.0 MHz, and 100.0 MHz.

For any of the above aspects, each of the plurality of variable-gain amplifiers may be capable of providing an output power of at least about 1000.0 W.

For any of the above aspects, the apparatus may additionally include a control module having circuitry to provide the control signal within 10.0 ns of receipt of a signal from one of the plurality of sensors.

Another aspect involves a multi-station integrated circuit fabrication chamber including: a plurality of stations; a plurality of radio frequency power generators configured to couple radio frequency power to an assigned station of the multi-station integrated circuit fabrication chamber, each radio frequency power generator including: a variable-gain preamplifier having an input port to receive a signal from an oscillator and having an output port to provide a signal of a varying power amplitude; a constant-gain amplifier having an input port to receive a signal from the variable-gain preamplifier and having an output port configured for coupling power to the assigned station, the coupled power to the assigned station to be provided to an electrode for generating plasma in the assigned station of the multi-station integrated circuit fabrication chamber; and a sensor coupled to a corresponding output port of the constant-gain amplifier.

For any of the above aspects, the oscillator may generate a periodic signal having a frequency selected from the group consisting of: 400.0 kHz, 1.0 MHz, 2.0 MHz, 13.56 MHz, 27.12 MHz, 60.0 MHz, and 100.0 MHz.

For any of the above aspects, the constant-gain amplifier may be capable of providing an output power of at least about 1000.0 W.

For any of the above aspects, each of the plurality of radio frequency power generators may be coupled to a sensor configured to detect an out-of-range parameter of the power coupled to the assigned station, the out-of-range parameter corresponding to one of the group consisting of: an output voltage magnitude, an output current magnitude, magnitude of power transmitted to the assigned station, and magnitude of power reflected from the assigned station.

For any of the above aspects, the sensor may be configured to detect the out-of-range parameter communicates a signal to the variable-gain preamplifier within about 10.0 ns of detecting the out-of-range parameter.

Another aspect involves a control module, the control module including: one or more input ports to obtain a signal from a radio frequency power sensor, the signal to indicate detection of an out-of-range parameter in an output signal from a radio frequency power generator; one or more output ports to provide a signal to an amplifier stage of the radio frequency power generator, the signal to the amplifier stage configured to modify a parameter of the output signal from the radio frequency power generator; and a processor to initiate generation of the signal from the one or more output ports within about 10.0 ns of obtaining the signal from the radio frequency power sensor.

For any of the above aspects, the radio frequency power generator may operate at a frequency selected from the group consisting of 400.0 kHz, 1.0 MHz, 2.0 MHz, 13.56 MHz, 27.12 MHz, 60.0 MHz, and 100.0 MHz.

For any of the above aspects, the out-of-range parameter of the output signal from the radio frequency power generator may include a phase angle between a voltage waveform and a current waveform.

For any of the above aspects, the out-of-range parameter may include power delivered from the radio frequency power generator.

For any of the above aspects, the radio frequency power generator may provide about 1.0 kW of power.

Another aspect involves method of generating radio frequency power adapted for coupling to an assigned station of a multi-station integrated circuit fabrication chamber, the including: generating a periodic signal; coupling the periodic signal to a plurality of variable-gain preamplifiers; coupling an output signal from each of the plurality of variable-gain preamplifiers to a corresponding one of a plurality of constant-gain amplifiers; and coupling an output signal from each of the plurality of constant-gain amplifiers to the assigned station of the multi-station integrated circuit fabrication chamber.

For any of the above aspects, the method may further include: sensing an out-of-range parameter in an output signal from one of the plurality of constant-gain amplifiers; and modifying the magnitude of the output signal from a variable-gain preamplifier, of the variable-gain preamplifiers, responsive to sensing the out-of-range parameter.

For any of the above aspects, the out-of-range parameter may correspond to power reflected from the assigned station of the multi-station integrated circuit fabrication chamber.

For any of the above aspects, the out-of-range parameter may correspond to the current conducted to the assigned station of the multi-station integrated circuit fabrication chamber.

For any of the above aspects, the out-of-range parameter may correspond to a voltage applied to the assigned of the multi-station integrated circuit fabrication chamber.

For any of the above aspects, the magnitude of the output signal from the variable-gain preamplifiers may be modified within 10.0 ns of sensing the out-of-range parameter.

For any of the above aspects, generating the periodic signal may include generating a signal having a frequency selected from the group consisting of 400.0 kHz, 1.0 MHz, 2.0 MHz, 13.56 MHz, 27.12 MHz, 60.0 MHz, and 100.0 MHz.

DETAILED DESCRIPTION

Figure 1A:
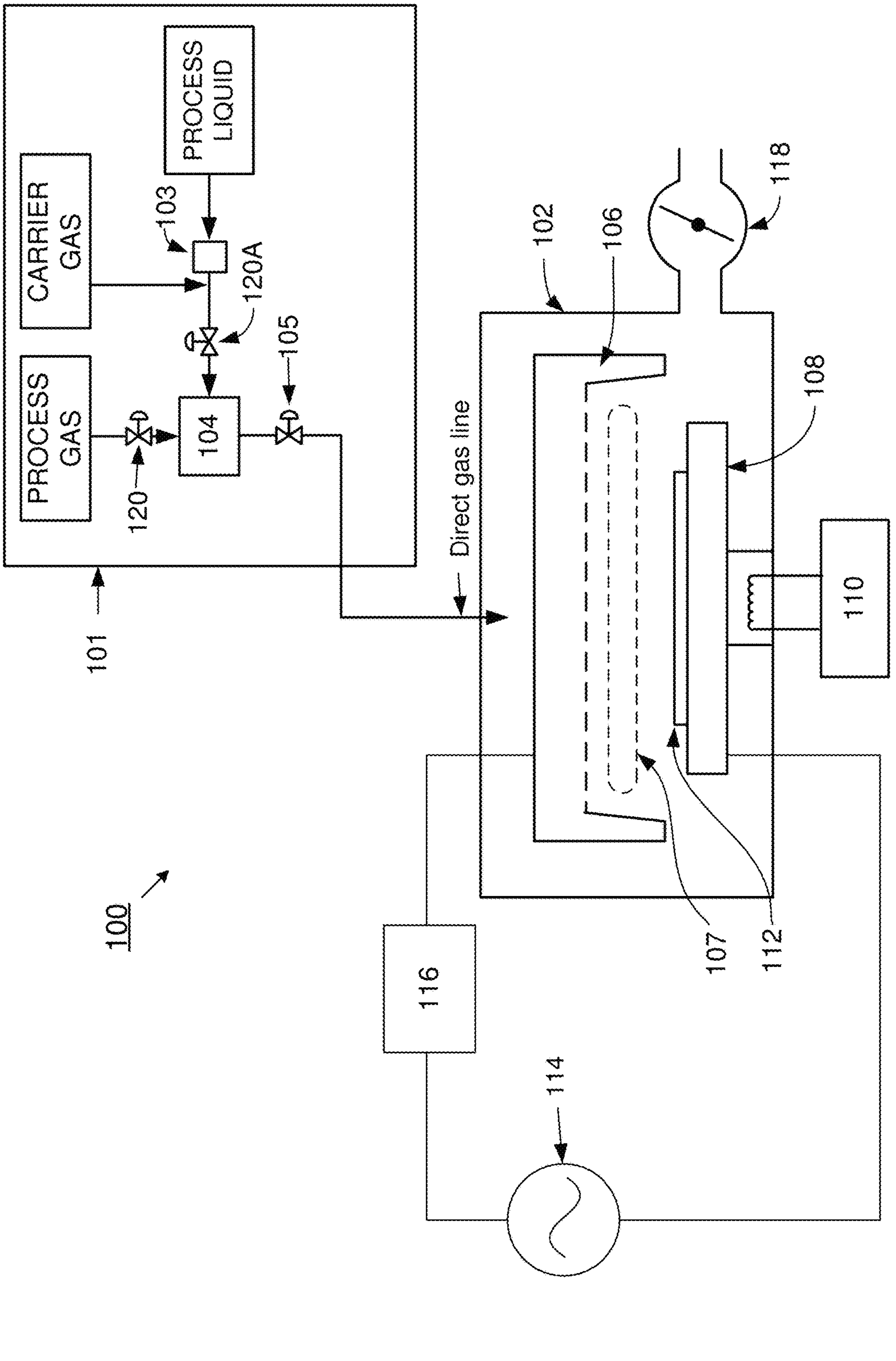
FIG. 1A shows a substrate processing apparatus for depositing a film on or over a semiconductor substrate utilizing any number of processes, according to various embodiments.

In particular embodiments, a radio frequency (RF) power generator having multiple output ports may be utilized in a variety of semiconductor fabrication processes, such as plasma-based wafer fabrication. For example, in a multi-station integrated circuit fabrication chamber, which may include individual process stations for performing deposition and/or etching processes, a particular output port may be assigned to, or otherwise configured to operate with, a corresponding station of the multi-station fabrication chamber. Accordingly, if a deposition rate, for example, within a particular station of the multi-station fabrication chamber, exhibits an increase or decrease in a deposition rate relative to other stations of the multi-station fabrication chamber, RF power parameters at the particular station can be adjusted. Such adjustment may bring about correction or equalizing of the deposition rate relative to the deposition rates of other chambers so as to bring about more uniform deposition across all process stations of a multi-station fabrication chamber. In some instances, such independent control over RF power coupled to individual assigned stations of a multi-station fabrication chamber may permit one or more stations to continue performing a fabrication process while other stations may have completed fabrication operations. This may allow a maximization in the yield of all wafers and/or devices fabricated by way of the multi-station fabrication chamber.

Particular embodiments may represent an improvement over other arrangements of RF power generators coupled to multi-station integrated circuit fabrication chambers. For example, in some embodiments, a RF power generator may utilize two or more signal amplifiers coupled to a power combiner. Output power from the RF power combiner, which may be coupled to a multi-station fabrication chamber by way of a single output port of the power combiner, may be coupled to a RF power divider to permit coupling of the divided RF power to input ports of the fabrication chamber. Consequently, as a result of the combining and subsequent dividing of RF power, all stations of the multi-station fabrication chamber may be controlled as a single entity, which may involve substantially identical RF power levels being delivered to each station. In addition to delivery of substantially identical RF power levels to all stations of a multi-station fabrication chamber, such combining and dividing of RF power may permit equal exposure of all stations of the multi-station chamber to any abnormalities in the RF power generated by the RF power generator. Accordingly, abnormalities such as overvoltage and/or overcurrent conditions, as well as changes in RF power delivered by the power combiner, which may negatively impact fabrication processes, may be coupled identically to all stations of the fabrication chamber. Such coupling of abnormal voltages, currents, and overall power into all stations of a multi-station integrated circuit fabrication chamber may degrade wafer yield as well as introduce unpredictable performance of fabricated circuit elements.

Certain embodiments and implementations may be utilized with a number of wafer fabrication processes, such as various plasma-enhanced atomic layer deposition (ALD) processes (e.g., ALD1, ALD2), various plasma-enhanced chemical vapor deposition (e.g., CVD1, CVD2, CVD3) processes, or may be utilized on-the-fly during single deposition processes. In certain embodiments, a RF power generator having multiple output ports may be utilized at any signal frequency, such as at frequencies between 300.0 kHz and 60.0 MHz, which may include frequencies of 400.0 kHz, 1.0 MHz, 2.0 MHz, 13.56 MHz, and 27.12 MHz However, in other embodiments, RF power generators having multiple output ports may operate at any signal frequency, which may include relatively low frequencies, such as between 50.0 kHz and 300.0 kHz, as well as higher signal frequencies, such as frequencies between 60.0 MHz and 100.0 MHz, virtually without limitation.

It should be noted that although particular embodiments described herein may show and/or describe RF power generators having multiple output ports in which an output port may be assigned to 1 of 4 process stations of a 4-station integrated circuit fabrication chamber, claimed subject matter may embrace multi-station integrated circuit fabrication chambers comprising any number of process stations. Thus, in embodiments, individual output ports of a RF power generator having multiple output ports may be assigned to a process station of a multi-station fabrication chamber having, for example, 2 process stations or 3 process stations. In other embodiments individual output ports of a RF power generator having multiple output ports may be assigned to process stations of a multi-station integrated circuit fabrication chamber having a larger number of process station, such as 5 process stations, 6 process stations, 8 process stations, 10 process stations, or any other number of process stations, virtually without limitation.

Manufacture of semiconductor devices typically involves depositing one or more thin films on or over a planar or non-planar substrate in an integrated fabrication process. In some aspects of an integrated process, it may be useful to deposit thin films that conform to unique substrate topography. One type of reaction that is useful in some cases involves chemical vapor deposition (CVD). In typical CVD processes, gas phase reactants introduced into stations of a reaction chamber simultaneously undergo a gas-phase reaction. The products of the gas-phase reaction deposit on the surface of the substrate. A reaction of this type may be driven by, or enhanced by, presence of a plasma, in which case the process may be referred to as a plasma-enhanced chemical vapor deposition (PECVD) reaction. As used herein, the term CVD is intended to include PECVD unless otherwise indicated. CVD processes have certain disadvantages that render them less appropriate in some contexts. For instance, mass transport limitations of CVD gas phase reactions may bring about deposition effects that exhibit thicker deposition at top surfaces (e.g., top surfaces of gate stacks) and thinner deposition at recessed surfaces (e.g., bottom corners of gate stacks). Further, in response to some semiconductor die having regions of differing device density, mass transport effects across the substrate surface may result in within-die and within-wafer thickness variations. Thus, during subsequent etching processes, thickness variations can result in over-etching of some regions and under-etching of other regions, which can degrade device performance and die yield. Another difficulty related to CVD processes is that such processes are often unable to deposit conformal films in high aspect ratio features. This issue can be increasingly problematic as device dimensions continue to shrink. These and other drawbacks of particular aspects of wafer fabrication processes are discussed in relation to FIG. 1A and FIG. 1B.

In another example, some deposition processes involve multiple film deposition cycles, each producing a discrete film thickness. For example, in atomic layer deposition (ALD), thickness of a deposited layer may be limited by an amount of one or more film precursor reactants which may adsorb onto a substrate surface, so as to form an adsorption-limited layer, prior to the film-forming chemical reaction itself. Thus, a feature of ALD involves the formation of thin layers of film (such as layers having a width of a single atom or molecule) are used in a repeating and sequential matter. As device and feature sizes continue to be reduced in scale, and as three-dimensional devices and structures become more prevalent in integrated circuit (IC) design, the capability of depositing thin conformal films (e.g., films of material having a uniform thickness relative to the shape of the underlying structure) continues to gain in importance. Thus, in view of ALD being a film-forming technique in which each deposition cycle operates to deposit a single atomic or molecular layer of material, ALD may be well-suited to the deposition of conformal films. Typical device fabrication processes involving ALD may include multiple ALD cycles, which may number into the hundreds or thousands, may then be utilized to form films of virtually any desired thickness. Further, in view of each layer being thin and conformal, a film that results from such a process may conform to a shape of any underlying device structure. In certain embodiments, an ALD cycle may include the following steps:

Exposure of the substrate surface to a first precursor.

Purge of the reaction chamber in which the substrate is located.

Activation of a reaction of the substrate surface, typically with a plasma and/or a second precursor.

Purge of the reaction chamber in which the substrate is located.

The duration of each ALD cycle may typically be less than 25.0 seconds or less than 10.0 seconds or less than 5.0 seconds. The plasma exposure step (or steps) of the ALD cycle may be of a short duration, such as a duration of 1.0 second or less.

Turning now to the figures, FIG. 1A shows a substrate processing apparatus 100 for depositing films on semiconductor substrates using any number of processes, according to various embodiments. Processing apparatus 100 of FIG. 1A utilizes single process station 102 of a process chamber with a single substrate holder 108 (e.g., a pedestal) in an interior volume, which may be maintained under vacuum by vacuum pump 118. Showerhead 106 and gas delivery system 101, which may be fluidically coupled to the process chamber, may permit the delivery of film precursors, for example, as well as carrier and/or purge and/or process gases, secondary reactants, etc. Equipment utilized in the generation of plasma within the process chamber is also shown in FIG. 1A. The apparatus schematically illustrated in FIG. 1A may be adapted for performing, in particular, plasma-enhanced CVD.

In FIG. 1A, gas delivery system 101 includes a mixing vessel 104 for blending and/or conditioning process gases for delivery to showerhead 106. One or more mixing vessel inlet valves 120 may control introduction of process gases to mixing vessel 104. Particular reactants may be stored in liquid form prior to vaporization and subsequent delivery to process station 102 of a process chamber. The embodiment of FIG. 1A includes a vaporization point 103 for vaporizing liquid reactant to be supplied to mixing vessel 104. In some implementations, vaporization point 103 may comprise a heated liquid injection module. In some other implementations, vaporization point 103 may comprise a heated vaporizer. In yet other implementations, vaporization point 103 may be eliminated from the process station. In some implementations, a liquid flow controller (LFC) upstream of vaporization point 103 may be provided for controlling a mass flow of liquid for vaporization and delivery to process station 102.

Showerhead 106 may operate to distribute process gases and/or reactants (e.g., film precursors) toward substrate 112 at the process station, the flow of which is controlled by one or more valves upstream from the showerhead (e.g., valves 120, 120A, 105). In the embodiment depicted in FIG. 1A, substrate 112 is depicted as located beneath showerhead 106, and is shown resting on a pedestal 108. Showerhead 106 may comprise any suitable shape, and may include any suitable number and arrangement of ports for distributing process gases to substrate 112. In some embodiments with two or more stations, gas delivery system 101 includes valves or other flow control structures upstream from the showerhead, which can independently control the flow of process gases and/or reactants to each station so as to permit gas flow cut that to one station while prohibiting gas flow to a second station. Furthermore, gas delivery system 101 may be configured to independently control process gases and/or reactants delivered to each station in a multi-station apparatus such that the gas composition provided to different stations is different; e.g., the partial pressure of a gas component may vary between stations at the same time.

In FIG. 1A, volume 107 is depicted as being located beneath showerhead 106. In some implementations, pedestal 108 may be raised or lowered to expose substrate 112 to volume 107 and/or to vary the size of volume 107. Optionally, pedestal 108 may be lowered and/or raised during portions of the deposition process to modulate process pressure, reactant concentration, etc., within volume 107. Showerhead 106 and pedestal 108 are depicted as being electrically coupled to radio frequency power supply 114 and matching network 116 for powering a plasma generator. Thus, showerhead 106 may function as an electrode for coupling radio frequency power into process station 102. In some implementations, the plasma energy is controlled (e.g., via a system controller having appropriate machine-readable instructions and/or control logic) by controlling one or more of a process station pressure, a gas concentration, a RF power generator, and so forth. For example, radio frequency power supply 114 and matching network 116 may be operated at any suitable RF power level, which may operate to form plasma having a desired composition of radical species. Likewise, RF power supply 114 may provide RF power of any suitable frequency, or group of frequencies, and power level.

In some implementations, the plasma ignition and maintenance conditions are controlled with appropriate hardware and/or appropriate machine-readable instructions in a system controller which may provide control instructions via a sequence of input/output control (IOC) instructions. In one example, the instructions for bringing about ignition or maintaining a plasma are provided in the form of a plasma activation recipe of a process recipe. In some cases, process recipes may be sequentially arranged, so that at least some instructions for the process can be executed concurrently. In some implementations, instructions for setting one or more plasma parameters may be included in a recipe preceding a plasma ignition process. For example, a first recipe may include instructions for setting a flow rate of an inert (e.g., helium) and/or a reactant gas, instructions for setting a plasma generator to a power set point and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure. In some deposition processes, a duration of a plasma strike may correspond to a duration of a few seconds, such as from 3.0 seconds to 15.0 seconds, or may involve longer durations, such as durations of up to 30.0 seconds, for example. In certain implementations described herein, much shorter plasma strikes may be applied during a processing cycle. Such plasma strike durations may be on the order of less than 50.0 milliseconds, with 25.0 milliseconds being utilized in a specific example.

Figure 1B:
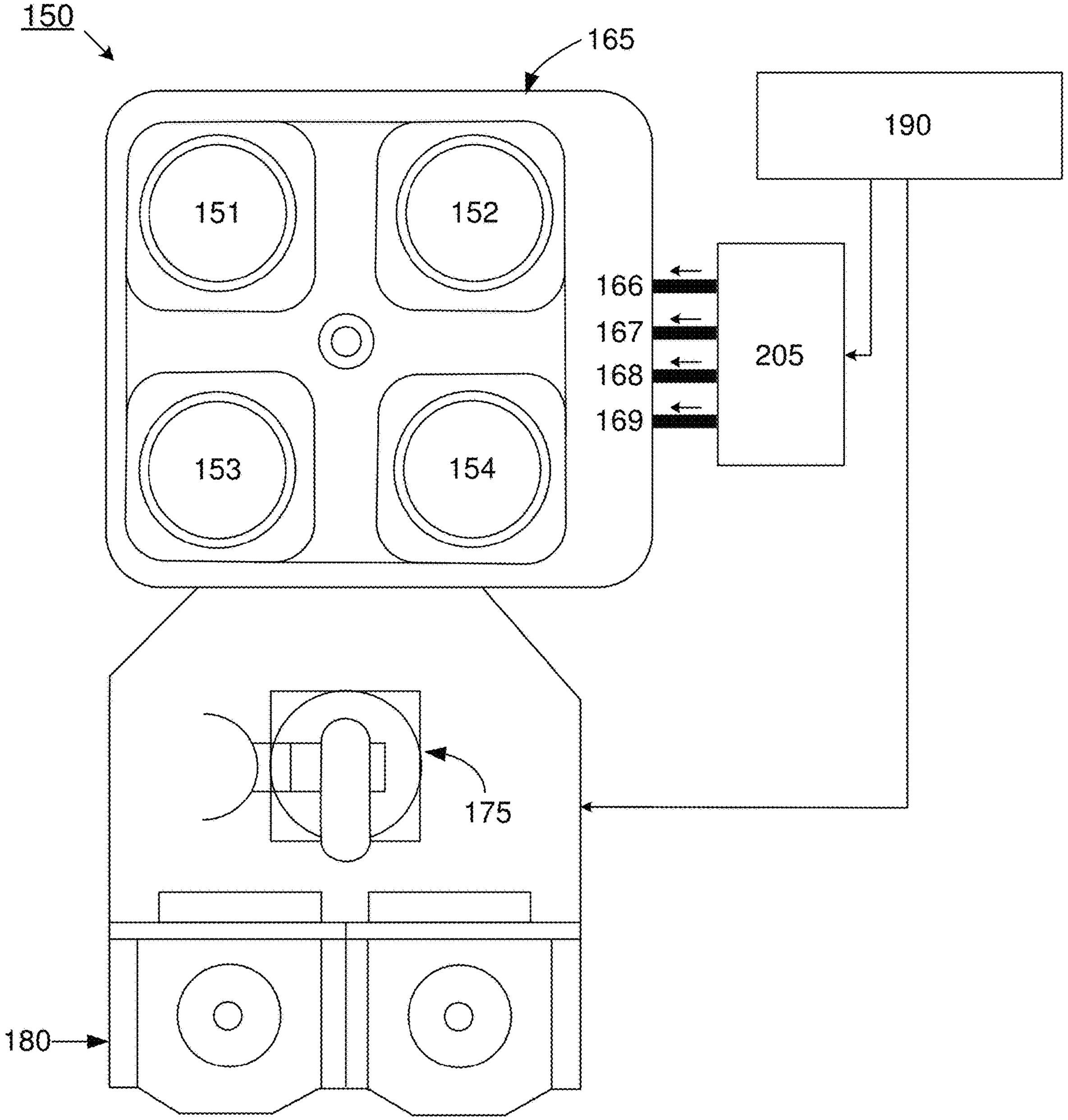
FIG. 1B depicts a schematic view of an embodiment of a multi-station processing tool.

For simplicity, processing apparatus 100 is depicted in FIG. 1A as a standalone station (102) of a process chamber for maintaining a low-pressure environment. However, it may be appreciated that a plurality of process stations may be included in a multi-station processing tool environment, such as shown in FIG. 1B, which depicts a schematic view of an embodiment of a multi-station processing tool. Processing tool 150 employs an integrated circuit fabrication chamber 165 that includes multiple fabrication process stations, each of which may be used to perform processing operations on a substrate held in a wafer holder, such as pedestal 108 of FIG. 1A, at a particular process station. In the embodiment of FIG. 1B, the integrated circuit fabrication chamber 165 is shown having four process stations 151, 152, 153, and 154. Other similar multi-station processing apparatuses may have more or fewer process stations depending on the implementation and, for instance, the desired level of parallel wafer processing, size/space constraints, cost constraints, etc. Also shown in FIG. 1B is substrate handler robot 175, which may operate under the control of system controller 190, configured to move substrates from a wafer cassette (not shown in FIG. 1B) from loading port 180 and into integrated circuit fabrication chamber 165, and onto one of process stations 151, 152, 153, and 154.

FIG. 1B also depicts an embodiment of a system controller 190 employed to control process conditions and hardware states of process tool 150. System controller 190 may include one or more memory devices, one or more mass storage devices, and one or more processors. The one or more processors may include a central processing unit, analog and/or digital input/output connections, stepper motor controller boards, etc. In some embodiments, system controller 190 controls all of the activities of process tool 150. System controller 190 executes system control software stored in a mass storage device, which may be loaded into a memory device, and executed on a processor of the system controller. Software to be executed by a processor of system controller 190 may include instructions for controlling the timing, mixture of gases, fabrication chamber and/or station pressure, fabrication chamber and/or station temperature, wafer temperature, substrate pedestal, chuck and/or susceptor position, number of cycles performed on one or more substrates, and other parameters of a particular process performed by process tool 150. These programed processes may include various types of processes including, but not limited to, processes related to determining an amount of accumulation on a surface of the chamber interior, processes related to deposition of film on substrates including numbers of cycles, determining and obtaining a number of compensated cycles, and processes related to cleaning the chamber. System control software, which may be executed by one or more processors of system controller 190, may be configured in any suitable way. For example, various process tool component subroutines or control objects may be written to control operation of the process tool components necessary to carry out various tool processes.

In some embodiments, software for execution by way of a processor of system controller 190 may include input/output control (IOC) sequencing instructions for controlling the various parameters described above. For example, each phase of deposition and deposition cycling of a substrate may include one or more instructions for execution by system controller 190. The instructions for setting process conditions for an ALD/CFD deposition process phase may be included in a corresponding ALD/CFD deposition recipe phase. In some embodiments, the recipe phases may be sequentially arranged, so that all instructions for a process phase are executed concurrently with that process phase.

Other computer software and/or programs stored on a mass storage device of system controller 190 and/or a memory device accessible to system controller 190 may be employed in some embodiments. Examples of programs or sections of programs for this purpose include a substrate positioning program, a process gas control program, a pressure control program, a heater control program, and a plasma control program. A substrate positioning program may include program code for process tool components that are used to load the substrate onto pedestal 108 (of FIG. 1A) and to control the spacing between the substrate and other parts of process tool 150. A positioning program may include instructions for appropriately moving substrates in and out of the reaction chamber as necessary to deposit films on substrates and clean the chamber.

A process gas control program may include code for controlling gas composition and flow rates and optionally for flowing gas into one or more process stations prior to deposition in order to stabilize the pressure in the process station. In some embodiments, the process gas control program includes instructions for introducing gases during formation of a film on a substrate in the reaction chamber. This may include introducing gases for a different number of cycles for one or more substrates within a batch of substrates. A pressure control program may include code for controlling the pressure in the process station by regulating, for example, a throttle valve in the exhaust system of the process station, a gas flow into the process station, etc. The pressure control program may include instructions for maintaining the same pressure during the deposition of differing number of cycles on one or more substrates during the processing of the batch.

A heater control program may include code for controlling the current to heating unit 110 that is used to heat the substrate. Alternatively, the heater control program may control delivery of a heat transfer gas (such as helium) to the substrate.

In some embodiments, there may be a user interface associated with system controller 190. The user interface may include a display screen, graphical software displays of the apparatus and/or process conditions, and user input devices such as pointing devices, keyboards, touch screens, microphones, etc.

In some embodiments, parameters adjusted by system controller 190 may relate to process conditions. Non-limiting examples include process gas composition and flow rates, temperature, pressure, plasma conditions, etc. These parameters may be provided to the user in the form of a recipe, which may be entered utilizing the user interface. The recipe for an entire batch of substrates may include compensated cycle counts for one or more substrates within the batch in order to account for thickness trending over the course of processing the batch.

Signals for monitoring the process may be provided by analog and/or digital input connections of system controller 190 from various process tool sensors. The signals for controlling the process may be output by way of the analog and/or digital output connections of process tool 150. Non-limiting examples of process tool sensors that may be monitored include mass flow controllers, pressure sensors (such as manometers), thermocouples, etc. Sensors may also be included and used to monitor and determine the accumulation on one or more surfaces of the interior of the chamber and/or the thickness of a material layer on a substrate in the chamber. Appropriately programmed feedback and control algorithms may be used with data from these sensors to maintain process conditions.

System controller 190 may provide program instructions for implementing the above-described deposition processes. The program instructions may control a variety of process parameters, such as DC power level, pressure, temperature, number of cycles for a substrate, amount of accumulation on at least one surface of the chamber interior, etc. The instructions may control the parameters to operate in-situ deposition of film stacks according to various embodiments described herein.

For example, the system controller may include control logic for performing the techniques described herein, such as determining an amount of accumulated deposition material currently on at least an interior region of the deposition chamber interior, applying the amount of accumulated deposition material determined in (a), or a parameter derived therefrom, to a relationship between (i) a number of ALD cycles required to achieve a target deposition thickness, and (ii) a variable representing an amount of accumulated deposition material, in order to obtain a compensated number of ALD cycles for producing the target deposition thickness given the amount of accumulated deposition material currently on the interior region of the deposition chamber interior, and performing the compensated number of ALD cycles on one or more substrates in the batch of substrates. The system may also include control logic for determining that the accumulation in the chamber has reached an accumulation limit and stopping the processing of the batch of substrates in response to that determination, and for causing a cleaning of the chamber interior.

In addition to the above-identified functions and/or operations performed by system controller 190 of FIG. 1B, the controller may additionally control and/or manage the operations of RF power generator 205, which may convey RF power to integrated circuit fabrication chamber 165 via radio frequency input ports 166, 167, 168, and 169. As described further herein, such operations may relate to, for example, determining upper and lower thresholds for RF power to be delivered to integrated circuit fabrication chamber 165, determining actual (such as real-time) levels of RF power delivered to integrated circuit fabrication chamber 165, RF power activation/deactivation times, RF power on/off duration, operating frequency, and so forth. Additionally, system controller 190 may determine a set of normal operating parameters of RF power to be delivered to integrated circuit fabrication chamber 165 by way of input ports 166, 167, 168, and 169. Such parameters may include upper and lower thresholds of, for example, power reflected from one or more of input ports 166-169 in terms of a reflection coefficient (e.g., the scattering parameter "$S_{11}$"), upper and lower thresholds of a voltage applied to one or more of input ports 166-169, upper and lower thresholds of current conducted through one or more of input ports 166-169, as well as an upper threshold for a magnitude of a phase angle between a voltage and a current conducted through one or more of input ports 166-169. Such thresholds may be utilized in defining "out-of-range" RF power parameters. For example, reflected power greater than an upper threshold may indicate an out-of-range RF power parameter. Likewise, an applied voltage or conducted current having a value below a lower threshold or greater than an upper threshold may indicate out-of-range RF power parameters. Similarly, a phase angle between an applied voltage and conducted current being greater than an upper threshold may indicate an out-of-range RF power parameter. Further, system controller 190 may provide settings for a control module of RF power generator 205, which may include control system response times, such as, 10.0 ns, 15.0 ns, 20.0 ns, and so forth.

In particular embodiments, integrated circuit fabrication chamber 165 may comprise input ports in addition to input ports 166-169 (additional input ports not shown in FIG. 1B). Accordingly, integrated circuit fabrication chamber 165 may utilize 8 RF input ports. In particular embodiments, process stations 151-154 of integrated circuit fabrication chamber 165 may each utilize first and second input ports in which a first input port may convey a signal having a first frequency and in which a second input port may convey a signal having a second frequency. Use of dual frequencies may bring about enhanced plasma characteristics, which may give rise to deposition rates within particular limits and/or more easily controlled deposition rates. Dual frequencies may bring about other desirable consequences, and claimed subject matter is not limited in this respect. In certain embodiments, frequencies of between 300.0 kHz and 65.0 MHz may be utilized. In some implementations, signal frequencies of 2.0 MHz or less may be referred to as low frequency (LF) while frequencies greater than 2.0 MHz may be referred to as high frequency (HF).

Accordingly, system controller 190 may permit independent operation of various signal paths within RF power generator 205. Such independence among paths may permit independent control over RF power coupled to individual assigned stations of integrated circuit fabrication chamber 165. Thus, as previously mentioned herein, if a deposition rate within a particular station of integrated circuit fabrication chamber 165 exhibits an increase or decrease in the deposition rate relative to other process stations of integrated circuit fabrication chamber 165, RF power parameters of a particular signal path within RF power generator 205 may be adjusted. Such adjustment may bring about correction or adjustment in the deposition rate relative to the deposition rates of other chambers, which may bring about more constant deposition rates across all process stations of integrated circuit fabrication chamber 165. Additionally, also as previously mentioned, such independent control over RF power coupled via independent signal paths of RF power generator 205 may permit one or more stations of integrated circuit fabrication chamber 165 to continue performing a fabrication process while other stations have completed fabrication operations. This may allow maximization in the yield of all wafers and/or all devices fabricated utilizing integrated circuit fabrication chamber 165.

Figure 2:
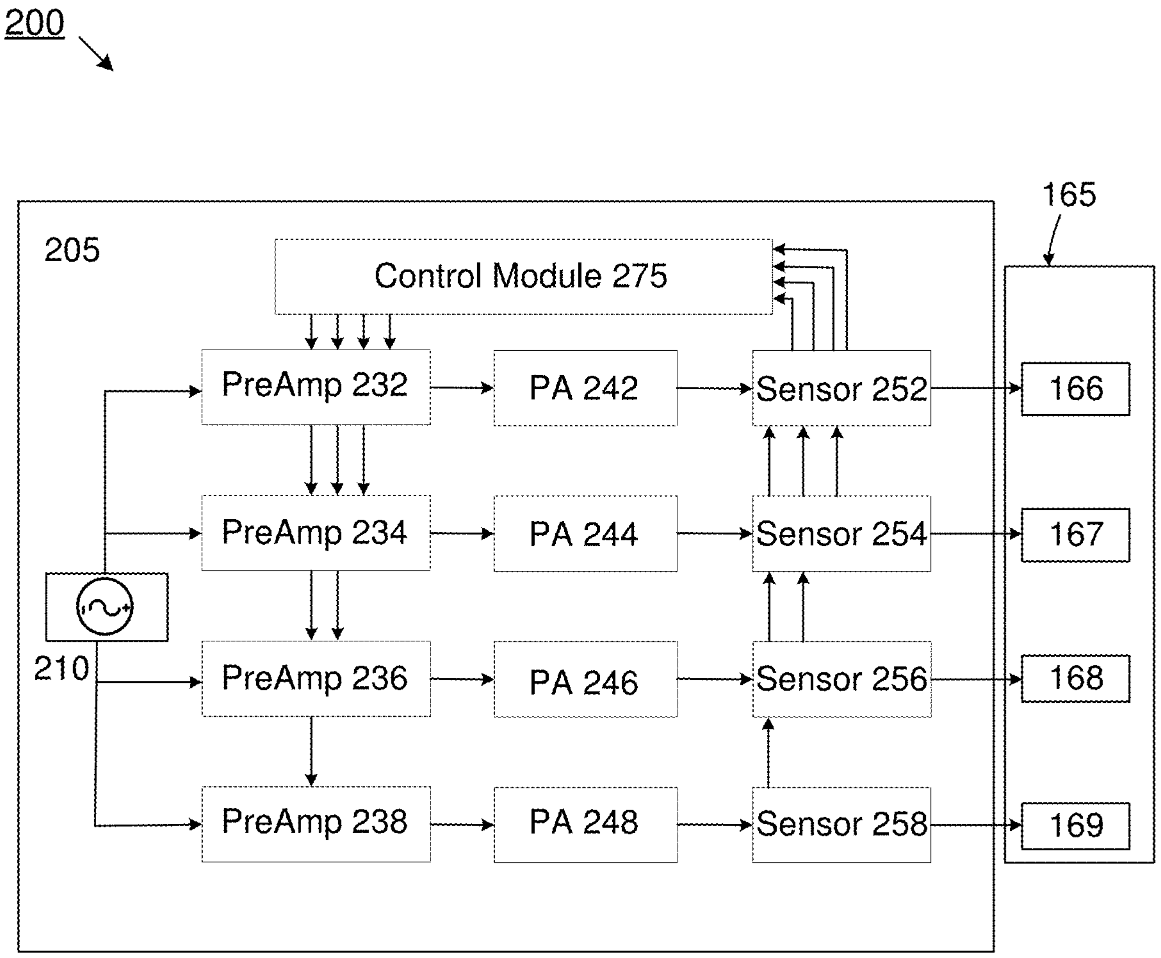
FIG. 2 is a schematic of a radio frequency (RF) power generator having multiple output ports, according to an embodiment.

FIG. 2 is a schematic of a RF power generator having multiple output ports according to an embodiment 200. As described in reference to FIG. 1B, RF power generator 205 may include independent signal paths, which may permit coupling to an assigned station of a multi-station fabrication chamber. Thus, RF power generator 205 includes 4 output ports for coupling to a corresponding number of input ports, such as input ports 166, 167, 168, and 169, of multi-station integrated circuit fabrication chamber 165. In particular implementations, RF power generator 205 may be capable of producing RF power in the range of 1.0 to 10.0 kW, such as 5.0 kW, 6.0 kW, or 8.0 kW. However, in particular implementations, RF power generator 205 may generate less than 1.0 kW, such as 500 W, 750 W, and so forth. In other implementations, RF power generator 205 may generate a power greater than 10.0 kW, such as 12.0 kW, 15.0 kW, 20.0 kW, and so forth. Additionally, although RF power generator 205 is depicted as comprising 4 independent signal paths, in other implementations, a RF power generator may comprise between 1-3 independent signal paths, for example, or may comprise greater than 4 signal paths, such as 5 signal paths, 6 signal paths, and so forth.

Oscillator 210 of RF power generator 205 may provide a periodic signal, such as a signal having a substantially fixed frequency of between 300.0 kHz and 100.0 MHz. However, in particular implementations, oscillator 210 may provide a periodic signal having a fixed frequency of between (and including) 400.0 kHz and 100.0 MHz, such as fixed frequencies of 400.0 kHz, 1.0 MHz, 2.0 MHz, 13.56 MHz, 27.12 MHz, 60.0 MHz, and 100.0 MHz an output signal from oscillator 210 may be coupled to an input port of preamplifiers 232, 234, 236, and 238, each of which may operate to controllably increase the magnitude of the signal received from oscillator 210. In the embodiment of FIG. 2, a gain parameter of each of preamplifiers 232-238 may be controlled via a signal from control module 275, which may give rise to an output signal having a varying amplitude. In particular implementations, each of preamplifiers 232-238 may amplify a signal from oscillator 210 by an amount of between 0.0 dB and 20.0 dB. However, in other implementations, control module 275 may operate to bring about different values of amplification by preamplifiers 232-238, such as by an amount of 10.0 dB and 23.0 dB A signal from an output port of preamplifier 232 is coupled to an input port of power amplifier 242 which, in the embodiment of FIG. 2, may represent a constant-gain amplifier, which may apply, for example, a gain of 30.0 dB. Accordingly, in particular implementations, a 1-watt signal from preamplifier 232 may be amplified by power amplifier 242 so as to provide a 1000-watt signal at an output port of amplifier 242. In a similar manner, power amplifier 244 may apply a similar (e.g., 30.0 dB) gain to a signal from preamplifier 234. Likewise, power amplifier 246 may apply a similar (e.g., 30.0 dB) gain to a signal from preamplifier 236. Likewise, power amplifier 248 may apply a similar (e.g., 30.0 dB) gain to a signal from preamplifier 238. It should be noted that in other implementations, power amplifiers 242-248 may apply different values of gain, such as gain of less than 30.0 dB, such as 25.0 dB, 20.0 dB, or may apply an amplifier gain greater than 30.0 dB, such as 33.0 dB, 35.0 dB, or 40.0 dB, and claimed subject matter is not limited in this respect.

A signal from an output port of power amplifier 242 may be coupled to sensor 252, which may monitor or detect parameters of power delivered to input port 166, which may correspond to an input port of a process station of integrated circuit fabrication chamber 165. Additionally, sensor 252 may operate to measure power reflected from input port 166 of integrated circuit fabrication chamber 165. Thus, responsive to a measurable change detected in power transmitted to, or reflected from, input port 166, sensor 252 may provide a corresponding indication to control module 275. In turn, control module 275 may direct preamplifier 232 to compensate for the detected change in output power generated and coupled to the input port of power amplifier 242. Such compensation may assist in maintaining a constant power delivered to input port 166.

In some implementations, sensor 252 may measure additional parameters, such as voltage magnitude of the output signal from amplifier 242, current conducted by the output signal from amplifier 242, as well as a phase angle between the voltage and current of the output signal. Thus, responsive to changes in voltage or current of a signal delivered to input port 166, or in response to a phase angle (θ) between output signal voltage (V) and current (I) exceeding a threshold value, which may indicate a drop in real power (VI cos(θ)) delivered to input port 166, sensor 252 may provide an indication to control module 275. In turn, control module 275 may direct preamplifier 232 to increase output power coupled to an input port of power amplifier 242, which may operate to maintain a constant power delivered to input port 166. Sensors 254, 256, and 258 may operate in a manner similar to that of sensor 252, by monitoring output voltage, current, and phase of a signal from corresponding power amplifiers 244, 246, and 248.

In particular implementations, control module 275 may respond to input signals from sensors 252-258 in a manner that that permits rapid adjustment in the parameters of output signals from power amplifiers 242-248. Such rapid adjustment in parameters of output signals from power amplifiers 242-248 may ensure that out-of-range parameters of signals coupled to input ports 166-169 of integrated circuit fabrication chamber 165 do not give rise to anomalies within process stations for extended periods of time. Thus, for example, responsive to sensor 252 detecting a decrease in power coupled or transmitted to input port 166 of integrated circuit fabrication chamber 165, which may momentarily decrease the deposition rate of an assigned process station of the chamber, output signal power from power amplifier 242 may be quickly increased so as to minimize any effects of such decrease in deposition on wafer processing operations. In particular implementations, control module 275 may respond to a detected out-of-range parameter in an output signal from one or more of power amplifiers 242-248, such as by modifying a gain parameter of one or more of preamplifiers 232-238, within 10.0 ns. However, in other implementations, control module 275 may respond to detected out-of-range parameters in output signals from a power amplifier within a larger period of time, such as within 15.0 ns, 20.0 ns, or 25.0 ns, for example.

Figure 3:
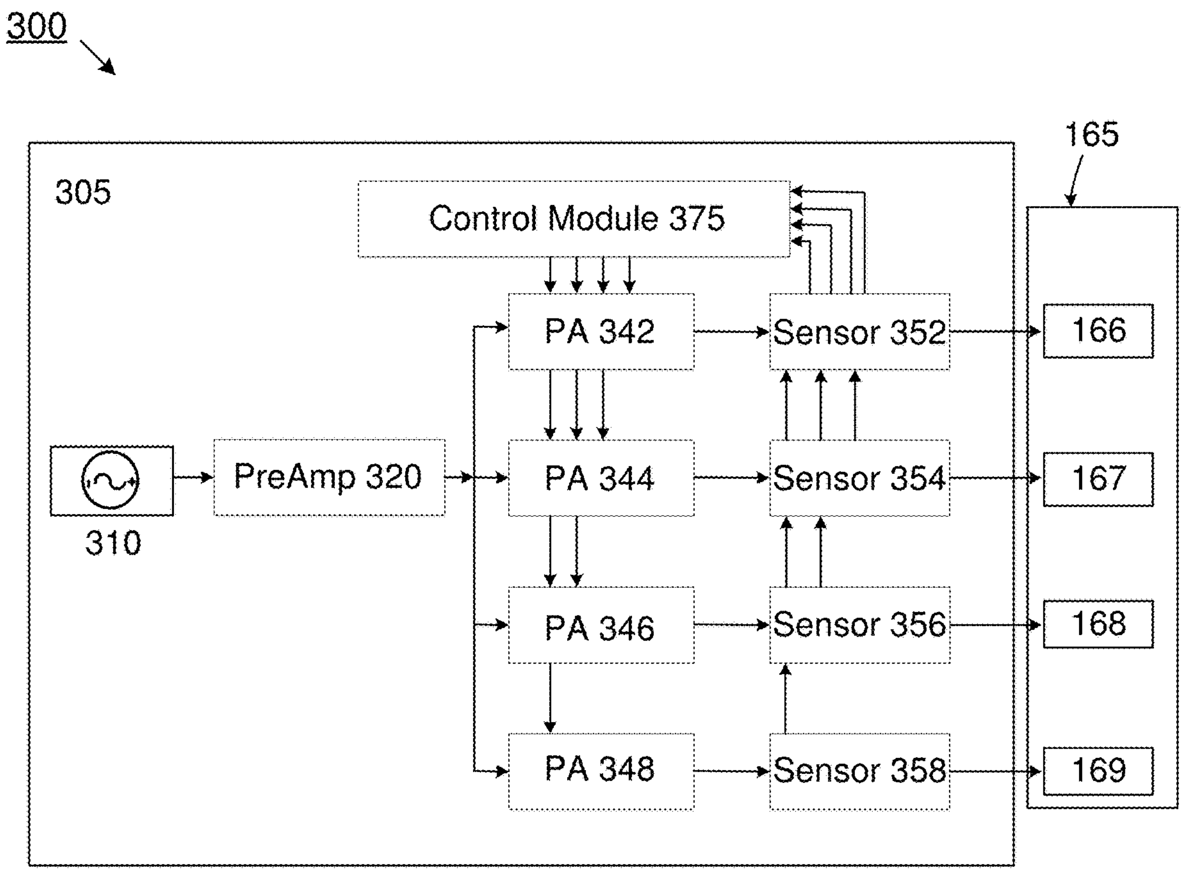
FIG. 3 is a schematic of a RF power generator having multiple output ports according to an embodiment.

FIG. 3 is a schematic of a RF power generator having multiple output ports, according to an embodiment 300. In a manner similar to that of RF power generator 205 described with reference to FIG. 2, RF power generator 305 may include independent signal paths, which may permit coupling to an assigned station of, for example, integrated circuit fabrication chamber 165. Accordingly, RF power generator 305 includes 4 output ports for coupling to a corresponding number of input ports, such as input ports 166, 167, 168, and 169, of integrated circuit fabrication chamber 165. In particular implementations, RF power generator 305 may be capable of producing RF power in the range of 1.0 to 10.0 kW, such as 5.0 kW, 6.0 kW, or 8.0 kW. However, in particular implementations, RF power generator 305 may generate less than 1.0 kW, such as 500 W, 750 W, and so forth. In other implementations, RF power generator 305 may generate a power greater than 10.0 kW, such as 12.0 kW, 15.0 kW, 20.0 kW, and so forth. Additionally, although RF power generator 305 is depicted as comprising 4 independent signal paths, in other implementations, a RF power generator may comprise between 1-3 independent signal paths, for example, or may comprise greater than 4 signal paths, such as 5 signal paths, 6 signal paths, and so forth.

Oscillator 310 of RF power generator 305 may provide a periodic signal, such as a signal having a substantially fixed frequency of between, for example, 300.0 kHz and 100.0 MHz. However, in particular implementations, oscillator 310 may provide a periodic signal having a fixed frequency of between 400.0 kHz and 100.0 MHz, such as fixed frequencies of 400.0 kHz, 1.0 MHz, 2.0 MHz, 13.56 MHz, 27.12 MHz, 60.0 MHz, and 100.0 MHz. An output signal from oscillator 310 may be coupled to an input port of preamplifier 320, which may operate to apply a constant gain to the signal received from oscillator 310. In the embodiment of FIG. 3, preamplifier 320 may amplify a signal from oscillator 310 by an amount of between 0.0 dB and 20.0 dB. However, in other embodiment, control module 375 may operate to bring about different values of amplification by preamplifiers 232-238, such as by an amount of 10.0 dB and 23.0 dB.

A signal from an output port of preamplifier 320 may be divided and coupled to input ports of power amplifiers 342, 344, 346, and 348, which, in the embodiment of FIG. 3, may represent variable-gain amplifiers, which may apply a gain of, for example, 20.0 dB and 40.0 dB. Accordingly, a 1-watt signal from preamplifier 320, for example, may be modified by each of power amplifiers 342, 344, 346, and 348 so as to provide a signal having a varying amplitude, such as an amplitude of between 100.0 W and 10.0 kW at a power amplifier output port. It should be noted that in other implementations, power amplifiers 342-348 may apply different values of gain, such as gain of less than 20.0 dB, such as 15.0 dB, 20.0 dB, or may apply an amplifier gain greater than 40.0 dB, such as 43.0 dB or 45.0 dB, and claimed subject matter is not limited in this respect.

Output signals from power amplifiers 342-348 may be coupled to an input port of sensors 352, 354, 356, and 358, which may operate to monitor or detect parameters of power delivered to, or reflected from, input ports 166, 167, 168, and 169 of integrated circuit fabrication chamber 165. In the embodiment of FIG. 3, sensor 352 may measure power coupled to (or transmitted to) input port 166 of integrated circuit fabrication chamber 165 as well as power reflected from input port 166 of integrated circuit fabrication chamber 165. Thus, responsive to a measurable change detected in power transmitted to input port 166, sensor 352 may provide a corresponding indication to control module 375. In turn, control module 375 may direct power amplifier 342, 344, 346, or 348 to compensate for the detected change by adjusting the output power generated by the corresponding power amplifier. Such compensation, which may involve modification of values of reactive circuit elements in an output stage of one or more of power amplifiers 342-348, may operate to maintain a constant power delivered to input ports 166-169. In a manner similar to that described in reference to FIG. 2, sensors 352-358 may additionally detect the phase angle (θ) between output signal voltage (V) and current (I) exceeding a threshold value, which may indicate a drop in real power (VI cos(θ)) delivered to input ports 166-169. Responsive to detection of a drop in real power delivered to input ports 166-169, control module 275 may adjust an output signal of one or more of power amplifiers 342-348, which may assist in maintaining a constant power delivered to input ports 166-169.

In particular implementations, control module 375 may respond to input signals from sensors 352-358 in a manner that permits rapid adjustment in the parameters of output signals from power amplifiers 342-348. Such rapid adjustment in parameters of output signals from power amplifiers 342-348 may ensure that out-of-range parameters of signals coupled to input ports 166-169 of integrated circuit fabrication chamber 165 do not give rise to anomalies within a process station of the chamber for extended periods of time. Thus, for example, responsive to sensor 352 detecting a decrease in power coupled or transmitted to input port 166 of integrated circuit fabrication chamber 165, which may momentarily decrease the deposition rate of an assigned process station of the chamber, output signal power from power amplifier 342 may be quickly increased so as to minimize any effects of such decrease in deposition on wafer processing operations. In particular implementations, control module 375 may respond to a detected out-of-range parameter in an output signal from one or more of power amplifiers 342-348, such as by modifying a gain parameter of one or more of power amplifiers 342-348, within 10.0 ns. However, in other implementations, control module 375 may respond to detected out-of-range parameters in output signals from a power amplifier within a larger period of time, such as within 15.0 ns, 20.0 ns, 25.0 ns, etc.

Figure 4:
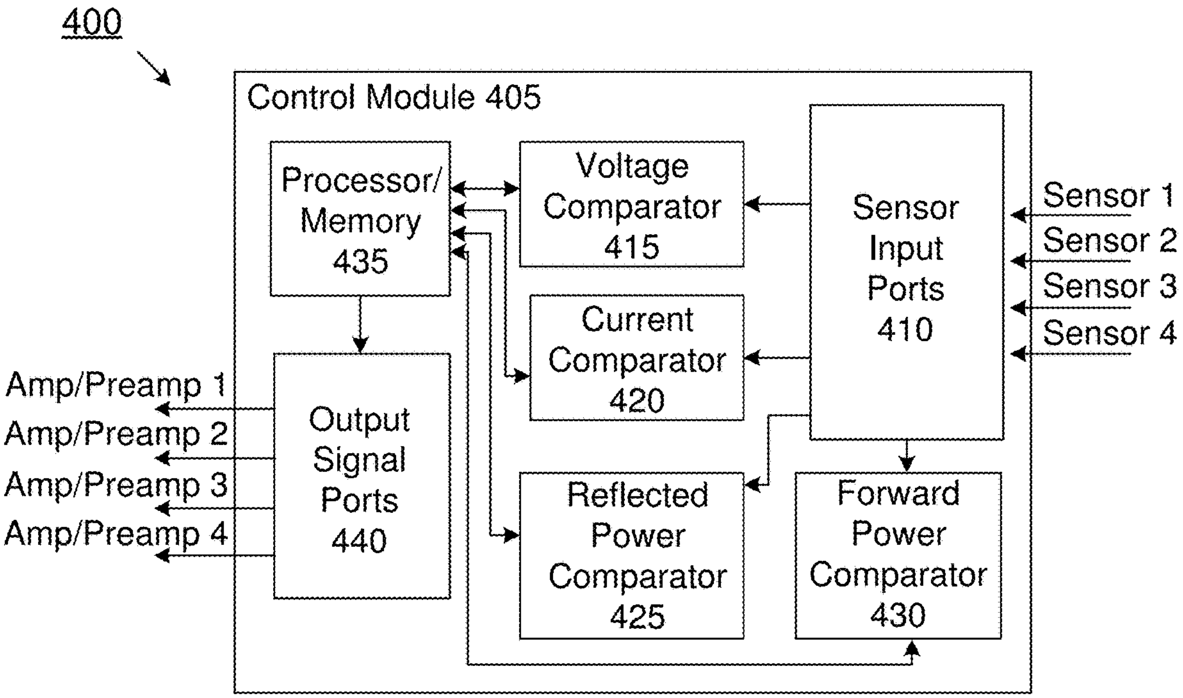
FIG. 4 is a schematic of a control module adapted for use in a RF generator having multiple output ports, according to an embodiment.

FIG. 4 is a schematic of a control module adapted for use in a RF generator having multiple output ports, according to an embodiment 400. Control module 405 may include many of the features of control modules 275 or 375, as described in reference to FIG. 2 and FIG. 3, respectively, and may operate to detect out-of-range parameters in an output signal from a RF power generator. In the embodiment of FIG. 4, control module 405 may include 4 sensor input ports 410, which may be suitable for obtaining input signals from a corresponding number of sensors for comparing output power parameters of amplifiers of a RF generator with predetermined threshold values. Thus, sensors 1, 2, 3, and 4 may correspond to sensors 252, 254, 256, and 258 (respectively) of FIG. 2, or may correspond to sensors 352, 354, 356, and 358 (respectively) of FIG. 3. However, it should be noted that control module 405 may be usable with a wide variety of other types of RF generators, and claimed subject matter is not limited to use of control module 405 with any particular RF generator. Further, in other implementations, control module 405 may include a smaller number of sensor input ports, such as 3 ports or fewer, or may include a larger number of sensor input ports, such as 5 ports, 6 ports, and so forth.

Signals from sensor input ports 410 may be connected or coupled to voltage comparator 415, current comparator 420, reflected power comparator 425, and forward power comparator 430. Accordingly, in cooperation with processor/memory 435, voltage comparator 415, which may be capable of measurement of both magnitude and phase angle of a voltage signal, may provide an indication to processor/memory 435 in response to determining that a voltage of an output signal of a RF generator has exceeded an upper threshold value or has fallen below a lower threshold value. Similarly, and also in cooperation with processor/memory 435, current comparator 420, which may be capable of measurement of both magnitude and phase angle of a current conducted from a RF generator, may provide an indication to processor/memory 435 in response to determining that an output current of a RF generator has exceeded an upper threshold value or has fallen below a lower threshold value. In addition, both voltage comparator 415 and current comparator 420, also in cooperation with processor/memory 435, may provide an indication that a phase angle between a measured voltage and a measured current has exceeded a threshold amount. In addition, control module 405 may include reflected power comparator 425, which may operate to determine if a value of power reflected from an input port of a multi-station fabrication chamber exceeds a threshold value. Control module 405 may further include forward power comparator 430, which may operate to determine if a value of power delivered or transmitted to an input port of a multi-station fabrication chamber exceeds an upper threshold value or falls below a lower threshold value.

Responsive to detection of one or more out-of-range parameters in an output signal from a RF power generator, processor/memory 435 may provide a signal to an amplifier stage of a RF power generator. Signals from processor/memory 435 may be conveyed through output signal ports 440 and may operate to modify a parameter of an output signal from the RF power generator. In particular implementations, processor/memory 435 may initiate generation of a signal from one or more of output signal ports 440 within about 10.0 ns of obtaining a signal from any of sensor input ports 410. In certain implementations, control module 405 may convey output signals to a preamplifier stage of a RF power generator, such as one or more of preamplifiers 232, 234, 236, and 238 of FIG. 2. In certain other implementations, control module may convey output signals to an amplifier stage of a RF power generator, such as one or more of power amplifiers 342, 344, 346, and 348 of FIG. 3.

Figure 5:
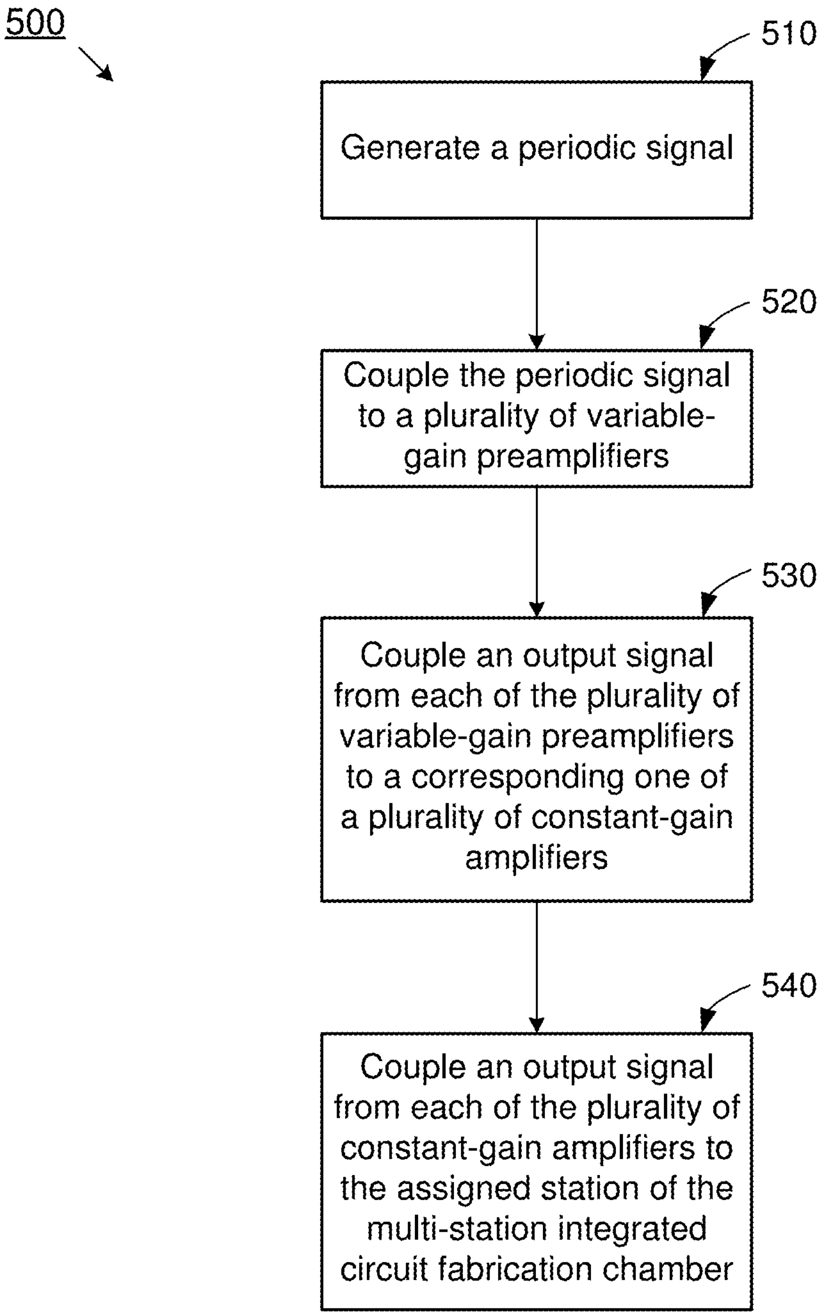
FIG. 5 is a flowchart for a method of generating radio frequency power adapted for coupling to an assigned station of a multi-station integrated circuit fabrication chamber, according to an embodiment.

FIG. 5 is a flowchart for a method 500 of generating radio frequency power adapted for coupling to an assigned station of a multi-station integrated circuit fabrication chamber, according to an embodiment. Embodiments of claimed subject matter may include actions in addition to those described in method 500, fewer actions than those described in method 500, or actions performed in an order different than described in method 500. Additionally, the apparatus of FIG. 1B, FIG. 2, and FIG. 3 may be suitable for performing the method of FIG. 5, although claimed subject matter is intended to embrace performance of the method of FIG. 5 utilizing alternative systems and/or apparatuses.

The method of FIG. 5 may begin at 510, in which a periodic signal may be generated by a suitable frequency generator, such as oscillator 210 of FIG. 2 or oscillator 310 of FIG. 3. In particular implementations, a frequency generator utilized at 510 may generate a signal having a frequency of between 300.0 kHz and 100.0 MHz. In certain implementations, a frequency generator used at 510 may generate a frequency of 400.0 kHz, 1.0 MHz, 2.0 MHz, 13.56 MHZ, 27.12 MHz, 60.0 MHz, and 100.0 MHz. The method of FIG. 5 may continue at 520, which may include coupling of the periodic signal to a plurality of variable gain preamplifiers. In a particular implementations, the plurality of variable-gain preamplifiers may include 4 preamplifiers, such as preamplifiers 232, 234, 236, and 238. The method may continue at 530, which may include coupling of an output signal from each of the plurality of variable-gain preamplifiers to a corresponding one of a plurality of constant-gain amplifiers. In certain implementations, 4 constant-gain preamplifiers may be utilized.

At 540, and output signal from each of the plurality of constant-gain amplifiers is coupled to the assigned station of a multi-station integrated circuit fabrication chamber. Thus, in some implementations, each station of a multi-station integrated circuit fabrication chamber is provided a supply of RF power from an assigned or dedicated signal path. Thus, responsive to sensing one or more out-of-range parameters in an output signal from one of the plurality of constant-gain amplifiers, the magnitude of an output signal from a variable-gain preamplifier, or a constant-gain amplifier, may be adjusted. Such adjustment may occur rapidly (e.g., within about 10.0 ns) bring the one or more out-of-range parameters in the output signal to within normal operating parameters.

Referring back to FIG. 1B, system controller 190 may comprise a portion of a system, which may form a part of the apparatus of FIGS. 1A/1B. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the number of cycles performed on a substrate, the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In the foregoing detailed description, numerous specific details are set forth to provide a thorough understanding of the presented embodiments or implementations. The disclosed embodiments or implementations may be practiced without some or all of these specific details. In other instances, well-known process operations have not been described in detail so as to not unnecessarily obscure the disclosed embodiments or implementations. While the disclosed embodiments or implementations are described in conjunction with the specific embodiments or implementations, it will be understood that such description is not intended to limit the disclosed embodiments or implementations.

The foregoing detailed description is directed to certain embodiments or implementations for the purposes of describing the disclosed aspects. However, the teachings herein can be applied and implemented in a multitude of different ways. In the foregoing detailed description, references are made to the accompanying drawings. Although the disclosed embodiments or implementation are described in sufficient detail to enable one skilled in the art to practice the embodiments or implementation, it is to be understood that these examples are not limiting; other embodiments or implementation may be used and changes may be made to the disclosed embodiments or implementation without departing from their spirit and scope. Additionally, it should be understood that the conjunction "or" is intended herein in the inclusive sense where appropriate unless otherwise indicated; for example, the phrase "A, B, or C" is intended to include the possibilities of "A," "B," "C," "A and B," "B and C," "A and C," and "A, B, and C."

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically includes a diameter of 200 mm, or 300 mm, or 450 mm. The foregoing detailed description assumes embodiments or implementations are implemented on a wafer, or in connection with processes associated with forming or fabricating a wafer. However, the claimed subject matter is not so limited. The work piece may be of various shapes, sizes, and materials. In addition to semiconductor wafers, other work pieces that may take advantage of claimed subject matter may include various articles such as printed circuit boards, or the fabrication of printed circuit boards, and the like.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

What is claimed is:

1. A multi-station integrated circuit fabrication chamber, comprising:
- a plurality of stations;
- a plurality of radio frequency power generators configured to couple radio frequency power to an assigned station of the multi-station integrated circuit fabrication chamber, each radio frequency power generator comprising:
  - a variable-gain preamplifier having an input port to receive a signal from an oscillator and having an output port to provide a signal of a varying power amplitude;
  - a constant-gain amplifier having an input port to receive a signal from the variable-gain preamplifier and having an output port configured for coupling power to the assigned station,
  - the coupled power to the assigned station to be provided to an electrode for generating plasma in the assigned station of the multi-station integrated circuit fabrication chamber; and
  - a sensor coupled to a corresponding output port of the constant-gain amplifier.

2. The multi-station integrated circuit fabrication chamber of claim 1, wherein the oscillator generates a periodic signal having a frequency selected from the group consisting of: 400.0 kHz, 1.0 MHz, 2.0 MHz, 13.56 MHz, 27.12 MHz, 60.0 MHz, and 100.0 MHz.

3. The multi-station integrated circuit fabrication chamber of claim 2, wherein the constant-gain amplifier is capable of providing an output power of at least about 1000.0 W.

4. The multi-station integrated circuit fabrication chamber of claim 1, wherein each of the plurality of radio frequency power generators is coupled to a sensor configured to detect an out-of-range parameter of the power coupled to the assigned station, the out-of-range parameter corresponding to one of the group consisting of: an output voltage magnitude, an output current magnitude, magnitude of power transmitted to the assigned station, and magnitude of power reflected from the assigned station.

5. The multi-station integrated circuit fabrication chamber of claim 4, wherein the sensor configured to detect the out-of-range parameter communicates a signal to the variable-gain preamplifier within about 10.0 ns of detecting the out-of-range parameter.

6. A control module, comprising:
- one or more input ports to obtain a signal from a radio frequency power sensor, the signal to indicate detection of an out-of-range parameter in an output signal from a radio frequency power generator;
- one or more output ports to provide a signal to an amplifier stage of the radio frequency power generator, the signal to the amplifier stage configured to modify a parameter of the output signal from the radio frequency power generator; and
- a processor that receives the signal from the radio frequency power sensor and initiates generation of the signal from the one or more output ports that is provided to the amplifier stage within about 10.0 ns of obtaining the signal.

7. The control module of claim 6, wherein the radio frequency power generator operates at a frequency selected from the group consisting of 400.0 kHz, 1.0 MHz, 2.0 MHz, 13.56 MHz, 27.12 MHz, 60.0 MHz, and 100.0 MHz.

8. The control module of claim 6, wherein the out-of-range parameter of the output signal from the radio frequency power generator comprises a phase angle between a voltage waveform and a current waveform.

9. The control module of claim 6, wherein the out-of-range parameter comprises power delivered from the radio frequency power generator.

10. The control module of claim 6, wherein the radio frequency power generator provides about 1.0 kW of power.

11. The control module of claim 6, wherein the amplifier stage comprises a plurality of variable-gain preamplifiers.

12. The control module of claim 11, wherein the signal to the amplifier stage adjusts a gain of a preamplifier of the plurality of variable-gain preamplifiers.

13. The control module of claim 6, wherein the out-of-range parameter comprises a power, voltage, or current characteristic associated with a station of a plurality of stations of a multi-station integrated circuit fabrication chamber exceeding a threshold value.

14. The control module of claim 13, wherein the one or more input ports comprise a plurality of input ports configured to receive signals from a plurality of radio frequency power sensors including the radio frequency power sensor, each radio frequency power sensor of the plurality of radio frequency power sensors corresponding to a station of the plurality of stations.

* * * * *